United States Patent
Maru et al.

(10) Patent No.: US 9,496,855 B2
(45) Date of Patent: *Nov. 15, 2016

(54) TWO TERMINAL DRIVE OF BIPOLAR JUNCTION TRANSISTOR (BJT) OF A LIGHT EMITTING DIODE (LED)-BASED BULB

(71) Applicant: Cirrus Logic, Inc., Austin, TX (US)

(72) Inventors: Siddharth Maru, Austin, TX (US); John L. Melanson, Austin, TX (US); (Continued)

(73) Assignee: CIRRUS LOGIC, INC., Austin, TX (US)

( * ) Notice: Subject to any disclaimer, the term of this patent is extended or adjusted under 35 U.S.C. 154(b) by 31 days.

This patent is subject to a terminal disclaimer.

(21) Appl. No.: 14/444,087

(22) Filed: Jul. 28, 2014

(65) Prior Publication Data

US 2015/0028764 A1 Jan. 29, 2015

Related U.S. Application Data

(60) Provisional application No. 61/889,101, filed on Oct. 10, 2013, provisional application No. 61/859,638, filed on Jul. 29, 2013.

(51) Int. Cl.
  *H05B 37/02* (2006.01)
  *H03K 4/48* (2006.01)
  *H05B 33/08* (2006.01)

(52) U.S. Cl.
  CPC ............ *H03K 4/48* (2013.01); *H05B 33/0815* (2013.01); *H05B 37/02* (2013.01); *Y02B 20/347* (2013.01)

(58) Field of Classification Search
  CPC ............................. H05B 37/02; H02M 3/335
  (Continued)

(56) References Cited

U.S. PATENT DOCUMENTS 3,660,751 A 5/1972 Bullinga
3,790,878 A 2/1974 Brokaw
(Continued)

FOREIGN PATENT DOCUMENTS

EP 0536535 A1 4/1993
EP 0636889 A1 2/1995
(Continued)

OTHER PUBLICATIONS

International Search Report and Written Opinion mailed Sep. 18, 2014, during examination of PCT/US2014/038490, cited references previously disclosed on Sep. 29, 2014.
(Continued)

*Primary Examiner* — Tung X Le
(74) *Attorney, Agent, or Firm* — Norton Rose Fulbright US LLP

(57) ABSTRACT

A bipolar junction transistor (BJT) may be used in a power stage DC-to-DC converter, such as for LED-based light bulbs. The BJT may be switched on and off from a controller coupled to two terminals of the BJT. Through the two terminals, the control IC may dynamically adjust a reverse recovery time period of the BJT. The reverse recovery time period may be adjusted by changing an amount of base charge that accumulates on the BJT. Additional, the reverse recovery may be controlled through the use of a reverse base current source applied to the BJT after beginning switching off the BJT.

28 Claims, 17 Drawing Sheets

(72) Inventors: Rahul Singh, Austin, TX (US); Eric King, Dripping Springs, TX (US); Thirumalai Rengachari, Austin, TX (US); Ramin Zanbaghi, Austin, TX (US); Arnab Kumar Dutta, Austin, TX (US)

(58) Field of Classification Search
USPC ............ 315/209 R, 224–225, 291, 294, 297, 315/307; 363/21
See application file for complete search history.

(56) References Cited

U.S. PATENT DOCUMENTS

| | | | |
|---|---|---|---|
| 4,322,785 A | 3/1982 | Walker | |
| 4,339,671 A | 7/1982 | Park et al. | |
| 4,342,956 A | 8/1982 | Archer | |
| 4,399,500 A | 8/1983 | Clarke et al. | |
| 4,410,810 A | 10/1983 | Christen | |
| 4,493,017 A | 1/1985 | Kammiller et al. | |
| 4,585,986 A | 4/1986 | Dyer | |
| 4,629,971 A | 12/1986 | Kirk | |
| 4,675,547 A | 6/1987 | Eichenwald | |
| 4,677,366 A | 6/1987 | Wilkinson et al. | |
| 4,683,529 A | 7/1987 | Bucher, II | |
| 4,737,658 A | 4/1988 | Kronmuller et al. | |
| 4,739,462 A | 4/1988 | Farnsworth et al. | |
| 4,937,728 A | 6/1990 | Leonardi | |
| 4,940,929 A | 7/1990 | Williams | |
| 4,970,635 A | 11/1990 | Shekhawat et al. | |
| 4,977,366 A | 12/1990 | Powell | |
| 5,001,620 A | 3/1991 | Smith | |
| 5,003,454 A | 3/1991 | Bruning | |
| 5,055,746 A | 10/1991 | Hu et al. | |
| 5,109,185 A | 4/1992 | Ball | |
| 5,173,643 A | 12/1992 | Sullivan et al. | |
| 5,264,780 A | 11/1993 | Bruer et al. | |
| 5,278,490 A | 1/1994 | Smedley | |
| 5,383,109 A | 1/1995 | Maksimovic et al. | |
| 5,424,665 A | 6/1995 | Sueri et al. | |
| 5,424,932 A | 6/1995 | Inou et al. | |
| 5,430,635 A | 7/1995 | Liu | |
| 5,479,333 A | 12/1995 | McCambridge et al. | |
| 5,481,178 A | 1/1996 | Wilcox et al. | |
| 5,486,781 A | 1/1996 | Im | |
| 5,565,761 A | 10/1996 | Hwang | |
| 5,638,265 A | 6/1997 | Gabor | |
| 5,691,890 A | 11/1997 | Hyde | |
| 5,747,977 A | 5/1998 | Hwang | |
| 5,757,635 A | 5/1998 | Seong | |
| 5,764,039 A | 6/1998 | Choi et al. | |
| 5,783,909 A | 7/1998 | Hochstein | |
| 5,798,635 A | 8/1998 | Hwang et al. | |
| 5,808,453 A | 9/1998 | Lee et al. | |
| 5,874,725 A | 2/1999 | Yamaguchi | |
| 5,960,207 A | 9/1999 | Brown | |
| 5,994,885 A | 11/1999 | Wilcox et al. | |
| 6,043,633 A | 3/2000 | Lev et al. | |
| 6,084,450 A | 7/2000 | Smith et al. | |
| 6,091,233 A | 7/2000 | Hwang et al. | |
| 6,160,724 A | 12/2000 | Hemena et al. | |
| 6,229,292 B1 | 5/2001 | Redl et al. | |
| 6,259,614 B1 | 7/2001 | Ribarich et al. | |
| 6,300,723 B1 | 10/2001 | Wang et al. | |
| 6,304,066 B1 | 10/2001 | Wilcox et al. | |
| 6,304,473 B1 | 10/2001 | Telefus et al. | |
| 6,343,026 B1 | 1/2002 | Perry | |
| 6,356,040 B1 | 3/2002 | Preis et al. | |
| 6,445,600 B2 | 9/2002 | Ben-Yaakov | |
| 6,469,484 B2 | 10/2002 | L'Hermite et al. | |
| 6,510,995 B2 | 1/2003 | Muthu et al. | |
| 6,531,854 B2 | 3/2003 | Hwang | |
| 6,580,258 B2 | 6/2003 | Wilcox et al. | |
| 6,583,550 B2 | 6/2003 | Iwasa et al. | |
| 6,628,106 B1 | 9/2003 | Batarseh et al. | |
| 6,657,417 B1 | 12/2003 | Hwang | |
| 6,661,182 B2 | 12/2003 | Sridharan | |
| 6,696,803 B2 | 2/2004 | Tao et al. | |
| 6,724,174 B1 | 4/2004 | Esteves et al. | |
| 6,758,199 B2 | 7/2004 | Masters et al. | |
| 6,768,655 B1 | 7/2004 | Yang et al. | |
| 6,781,351 B2 | 8/2004 | Mednik et al. | |
| 6,839,247 B1 | 1/2005 | Yang et al. | |
| 6,882,552 B2 | 4/2005 | Telefus et al. | |
| 6,894,471 B2 | 5/2005 | Corva et al. | |
| 6,933,706 B2 | 8/2005 | Shih | |
| 6,940,733 B2 | 9/2005 | Schie et al. | |
| 6,944,034 B1 | 9/2005 | Shteynberg et al. | |
| 6,956,750 B1 | 10/2005 | Eason et al. | |
| 6,975,523 B2 | 12/2005 | Kim et al. | |
| 6,980,446 B2 | 12/2005 | Simada et al. | |
| 7,042,161 B1 | 5/2006 | Konopka | |
| 7,072,191 B2 | 7/2006 | Nakao et al. | |
| 7,099,163 B1 | 8/2006 | Ying | |
| 7,161,816 B2 | 1/2007 | Shteynberg et al. | |
| 7,221,130 B2 | 5/2007 | Ribeiro et al. | |
| 7,224,206 B2 | 5/2007 | Pappalardo et al. | |
| 7,233,135 B2 | 6/2007 | Noma et al. | |
| 7,266,001 B1 | 9/2007 | Notohamiprodjo et al. | |
| 7,292,013 B1 | 11/2007 | Chen et al. | |
| 7,295,452 B1 | 11/2007 | Liu | |
| 7,411,379 B2 | 8/2008 | Chu et al. | |
| 7,414,371 B1 | 8/2008 | Choi et al. | |
| 7,439,810 B2 | 10/2008 | Manicone et al. | |
| 7,449,841 B2 | 11/2008 | Ball | |
| 7,554,473 B2 | 6/2009 | Melanson | |
| 7,567,091 B2 | 7/2009 | Farnworth et al. | |
| 7,606,532 B2 | 10/2009 | Wuidart | |
| 7,667,986 B2 | 2/2010 | Artusi et al. | |
| 7,684,223 B2 | 3/2010 | Wei | |
| 7,719,246 B2 | 5/2010 | Melanson | |
| 7,719,248 B1 | 5/2010 | Melanson | |
| 7,746,043 B2 | 6/2010 | Melanson | |
| 7,804,480 B2 | 9/2010 | Jeon et al. | |
| 7,834,553 B2 | 11/2010 | Hunt et al. | |
| 7,859,488 B2 | 12/2010 | Kimura | |
| 7,872,883 B1 | 1/2011 | Elbanhawy | |
| 7,894,216 B2 | 2/2011 | Melanson | |
| 8,008,898 B2 | 8/2011 | Melanson et al. | |
| 8,169,806 B2 | 5/2012 | Sims et al. | |
| 8,193,717 B2 | 6/2012 | Leiderman | |
| 8,222,772 B1 | 7/2012 | Vinciarelli | |
| 8,242,764 B2 | 8/2012 | Shimizu et al. | |
| 8,248,145 B2 | 8/2012 | Melanson | |
| 8,369,109 B2 | 2/2013 | Niedermeier et al. | |
| 8,441,220 B2 | 5/2013 | Imura | |
| 8,536,799 B1 | 9/2013 | Grisamore et al. | |
| 8,610,364 B2 | 12/2013 | Melanson et al. | |
| 8,823,283 B2 * | 9/2014 | Kesterson | 315/186 |
| 2002/0082056 A1 | 6/2002 | Mandai et al. | |
| 2003/0090252 A1 | 5/2003 | Hazucha | |
| 2003/0111969 A1 | 6/2003 | Konishi et al. | |
| 2003/0160576 A1 | 8/2003 | Suzuki | |
| 2003/0174520 A1 | 9/2003 | Bimbaud | |
| 2003/0214821 A1 | 11/2003 | Giannopoulos et al. | |
| 2003/0223255 A1 | 12/2003 | Ben-Yaakov et al. | |
| 2004/0046683 A1 | 3/2004 | Mitamura et al. | |
| 2004/0196672 A1 | 10/2004 | Amei | |
| 2005/0057237 A1 | 3/2005 | Clavel | |
| 2005/0207190 A1 | 9/2005 | Gritter | |
| 2005/0231183 A1 | 10/2005 | Li et al. | |
| 2005/0270813 A1 | 12/2005 | Zhang et al. | |
| 2005/0275354 A1 | 12/2005 | Hausman et al. | |
| 2006/0013026 A1 | 1/2006 | Frank et al. | |
| 2006/0022648 A1 | 2/2006 | Ben-Yaakov et al. | |
| 2006/0214603 A1 | 9/2006 | Oh et al. | |
| 2007/0103949 A1 | 5/2007 | Tsuruya | |
| 2007/0182347 A1 | 8/2007 | Shteynberg et al. | |
| 2008/0018261 A1 | 1/2008 | Kastner | |
| 2008/0043504 A1 | 2/2008 | Ye et al. | |
| 2008/0062584 A1 | 3/2008 | Freitag et al. | |
| 2008/0062586 A1 | 3/2008 | Apfel | |
| 2008/0117656 A1 | 5/2008 | Clarkin | |
| 2008/0130336 A1 | 6/2008 | Taguchi | |
| 2008/0175029 A1 | 7/2008 | Jung et al. | |

(56) References Cited

U.S. PATENT DOCUMENTS

| | | |
|---|---|---|
| 2008/0259655 A1 | 10/2008 | Wei et al. |
| 2008/0278132 A1 | 11/2008 | Kesterson et al. |
| 2008/0310194 A1 | 12/2008 | Huang et al. |
| 2009/0040796 A1 | 2/2009 | Lalithambika et al. |
| 2009/0059632 A1 | 3/2009 | Li et al. |
| 2009/0067204 A1 | 3/2009 | Ye et al. |
| 2009/0108677 A1 | 4/2009 | Walter et al. |
| 2009/0184665 A1 | 7/2009 | Ferro |
| 2009/0295300 A1 | 12/2009 | King |
| 2010/0128501 A1 | 5/2010 | Huang et al. |
| 2010/0202165 A1 | 8/2010 | Zheng et al. |
| 2010/0238689 A1 | 9/2010 | Fei et al. |
| 2010/0244793 A1 | 9/2010 | Caldwell |
| 2011/0110132 A1 | 5/2011 | Rausch et al. |
| 2011/0199793 A1 | 8/2011 | Kuang et al. |
| 2011/0276938 A1 | 11/2011 | Perry et al. |
| 2011/0291583 A1 | 12/2011 | Shen |
| 2011/0298442 A1 | 12/2011 | Waltisperger et al. |
| 2011/0309760 A1 | 12/2011 | Beland et al. |
| 2012/0062131 A1 | 3/2012 | Choi et al. |
| 2012/0146540 A1 | 6/2012 | Khayat et al. |
| 2012/0182003 A1 | 7/2012 | Flaibani et al. |
| 2012/0187997 A1 | 7/2012 | Liao et al. |
| 2012/0248998 A1 | 10/2012 | Yoshinaga |
| 2012/0286686 A1* | 11/2012 | Watanabe .......... H05B 33/0815 315/224 |
| 2012/0286843 A1 | 11/2012 | Kurokawa |
| 2012/0320640 A1 | 12/2012 | Baurle et al. |
| 2013/0088902 A1 | 4/2013 | Dunipace |
| 2013/0099694 A1* | 4/2013 | Naruo ................ H05B 33/0824 315/224 |
| 2013/0107595 A1 | 5/2013 | Gautier et al. |
| 2013/0181635 A1 | 7/2013 | Ling |
| 2013/0279209 A1* | 10/2013 | Zheng ................ H02M 3/33507 363/21.12 |
| 2014/0218978 A1 | 8/2014 | Heuken et al. |

FOREIGN PATENT DOCUMENTS

| | | |
|---|---|---|
| EP | 1213823 A2 | 6/2002 |
| EP | 1289107 A2 | 3/2003 |
| EP | 1962263 A2 | 8/2008 |
| EP | 2232949 A2 | 9/2010 |
| EP | 2257124 A1 | 12/2010 |
| JP | 2008053181 A | 3/2008 |
| WO | 01/84697 A2 | 11/2001 |
| WO | 2004051834 A1 | 6/2004 |
| WO | 2006013557 A2 | 2/2006 |
| WO | 2006/022107 A1 | 3/2006 |
| WO | 2007016373 A2 | 2/2007 |
| WO | 2008004008 A2 | 1/2008 |
| WO | 2008152838 A1 | 12/2008 |
| WO | 2010011971 A1 | 1/2010 |
| WO | 2010065598 A2 | 6/2010 |
| WO | 2011008635 A1 | 1/2011 |

OTHER PUBLICATIONS

International Search Report and Written Opinion mailed Sep. 16, 2014, during examination of PCT/US2014/038507, cited references previously disclosed on Sep. 29, 2014.

Maksimovic, et al, Impact of Digital Control in Power Electronics, International Symposium on Power Semiconductor Devices and ICS, 2004, pp. 2-22, Boulder, Colorado, USA.

Fairchild Semiconductor, Ballast Control IC, FAN 7711, Rev. 1.0.3, 2007, pp. 1-23, San Jose, California, USA.

Yao, Gang et al, Soft Switching Circuit for Interleaved Boost Converters, IEEE Transactions on Power Electronics, vol. 22, No. 1, Jan. 2007, pp. 1-8, Hangzhou China.

Stmicroelectronics, Transition Mode PFC Controller, Datasheet L6562, Rev. 8, Nov. 2005, pp. 1-16, Geneva, Switzerland.

Zhang, Wanfeng et al, A New Duty Cycle Control Strategy for Power Factor Correction and FPGA Implementation, IEEE Transactions on Power Electronics, vol. 21, No. 6, Nov. 2006, pp. 1-10, Kingston, Ontario, Canada.

Stmicroelectronics, Power Factor Connector L6561, Rev 16, Jun. 2004, pp. 1-13, Geneva, Switzerland.

Texas Instruments, Avoiding Audible Noise at Light Loads When Using Leading Edge Triggered PFC Converters, Application Report SLUA309A, Mar. 2004—Revised Sep. 2004, pp. 1-4, Dallas, Texas, USA.

Texas Instruments, Startup Current Transient of the Leading Edge Triggered PFC Controllers, Application Report SLUA321, Jul. 2004, pp. 1-4, Dallas, Texas, USA.

Texas Instruments, Current Sense Transformer Evaluation UCC3817, Application Report SLUA308, Feb. 2004, pp. 1-3, Dallas, Texas, USA.

Texas Instruments, BiCMOS Power Factor Preregulator Evaluation Board UCC3817, User's Guide, SLUU077C, Sep. 2000—Revised Nov. 2002, pp. 1-10, Dallas, Texas, USA.

Texas Instruments, Interleaving Continuous Conduction Mode PFC Controller, UCC28070, SLUS794C, Nov. 2007—Revised Jun. 2009, pp. 1-45, Dallas, Texas, USA.

Texas Instruments, 350-W Two-Phase Interleaved PFC Pre-regulator Design Review, Application Report SLUA369B, Feb. 2005—Revised Mar. 2007, pp. 1-22, Dallas, Texas, USA.

Texas Instruments, Average Current Mode Controlled Power Factor Correction Converter using TMS320LF2407A, Application Report SPRA902A, Jul. 2005, pp. 1-15, Dallas, Texas, USA.

Texas Instruments, Transition Mode PFC Controller, UCC28050, UCC28051, UCC38050, UCC38051, Application Note SLUS515D, Sep. 2002—Revised Jul. 2005, pp. 1-28, Dallas, Texas, USA.

Unitrode, High Power-Factor Preregulator, UC1852, UC2852, UC3852, Feb. 5, 2007, pp. 1-8, Merrimack, Maine, USA.

Unitrode, Optimizing Performance in UC3854 Power Factor Correction Applications, Design Note ON 39E, 1999, pp. 1-6, Merrimack, Maine, USA.

On Semiconductor Four Key Steps to Design a Continuous Conduction Mode PFC Stage Using the NCP1653, Application Note AND8184/D, Nov. 2004, pp. 1-8, Phoenix, AZ, USA.

Unitrode, BiCMOS Power Factor Preregulator, Texas Instruments, UCC2817, UCC2818, UCC3817, UCC3818, SLUS3951, Feb. 2000—Revised Feb. 2006, pp. 1-25, Dallas, Texas, USA.

Unitrode, UC3854AIB and UC3855A!B Provide Power Limiting with Sinusoidal Input Current for PFC Front Ends, SLUA196A, Design Note DN-66, Jun. 1995—Revised Nov. 2001, pp. 1-6, Merrimack, Maine, USA.

Unitrode, Programmable Output Power Factor Preregulator, UCC2819, UCC3819, SLUS482B, Apr. 2001—Revised Dec. 2004, pp. 1-16, Merrimack, Maine, USA.

Texas Instruments, UCC281019, 8-Pin Continuous Conduction Mode (CCM) PFC Controller, SLU828B, Revised Apr. 2009, pp. 1-48, Dallas, Texas, USA.

http://toolbarpdf.com/docs/functions-and-features-of=inverters.html, Jan. 20, 2011, pp. 1-8.

Zhou, Jinghai, et al, Novel Sampling Algorithm for DSP Controlled 2kW PFC Converter, IEEE Transactions on Power Electronics, vol. 16, No. 2, Mar. 2001, pp. 1-6, Hangzhou, China.

Mammano, Bob, Current Sensing Solutions for Power Supply Designers, Texas Instruments, 2001, pp. 1-36, Dallas, Texas, USA.

Fairchild Semiconductor, Ballast Control IC FAN7532, Rev. 1.0.3, Jun. 2006, pp. 1-16, San Jose, California, USA.

Fairchild Semiconductor, Simple Ballast Controller, FAN7544, Rev. 1.0.0, Sep. 21, 2004, pp. 1-14, San Jose, California, USA.

Texas Instruments, High Performance Power Factor Preregulator, UC2855A/B and UC3855A/B, SLUS328B, Jun. 1998, Revised Oct. 2005, pp. 1-14, Dallas, TX, USA.

Balogh, Laszlo, et al, Power-Factor Correction with Interleaved Boost Converters in Continuous-Inductr-Current Mode, 1993, IEEE, pp. 168-174, Switzerland.

Cheng, Hung L., et al, A Novel Single-Stage High-Power-Factor Electronic Ballast with Symmetrical Topology, Power Electronics and Motion Control Conference, 2006. IPEMC 2006. CES/IEEE 5th International, Aug. 14-16, 2006, vol. 50, No. 4, Aug. 2003, pp. 759-766, Nat. Ilan Univ., Taiwan.

(56) References Cited

OTHER PUBLICATIONS

Fairchild Semiconductor. Theory and Application of the ML4821 Average Current Mode PFC Controllerr, Fairchild Semiconductor Application Note 42030. Rev. 1.0, Oct. 25, 2000, pp. 1-19, San Jose, California, USA.
Garcia, 0., et al, High Efficiency PFC Converter to Meet EN610000302 and A14, Industrial Electronics, 2002. ISIE 2002. Proceedings of the 2002 IEEE International Symposium, vol. 3, pp. 975-980, Div. de Ingenieria Electronica, Univ. Politecnica de Madrid, Spain.
Infineon Technologies AG, Standalone Power Factor Correction (PFC) Controller in Continuous Conduction Mode (CCM), Infineon Power Management and Supply, CCM-PFC, ICE2PCS01, ICE2PCS01 G, Version 2.1, Feb. 6, 2007, p. 1-22, Munchen, Germany.
Lu, et al, Bridgeless PFC Implementation Using One Cycle Control Technique, International Rectifier, 2005, pp. 1-6, Blacksburg, VA, USA.
Brown, et al, PFC Converter Design with IR1150 One Cycle Control IC, International Rectifier, Application Note AN-1 077, pp. 1-18, El Segundo CA, USA.
International Rectifer, PFC One Cycle Control PFC IC, International Rectifier, Data Sheet No. PD60230 rev. C, IR1150(S)(PbF), IR11501(S)(PbF), Feb. 5, 2007, pp. 1-16, El Segundo, CA, USA.
International Rectifier, IRAC1150=300W Demo Board, User's Guide, Rev 3.0, International Rectifier Computing and Communications SBU-AC-DC Application Group, pp. 1-18, Aug. 2, 2005, El Segundo, CO USA.
Lai, Z., et al, A Family of Power-Factor-Correction Controller, Applied Power Electronics Conference and Exposition, 1997. APEC '97 Conference Proceedings 1997., Twelfth Annual, vol. 1, pp. 66-73, Feb. 23-27, 1997, Irvine, CA.
Lee, P, et al, Steady-State Analysis of an Interleaved Boost Converter with Coupled Inductors, IEEE Transactions on Industrial Electronics, vol. 47, No. 4, Aug. 2000, pp. 787-795, Hung Hom, Kowloon, Hong Kong.
Linear Technology, Single Switch PWM Controller with Auxiliary Boost Converter, Linear Technology Corporation, Data Sheet LT 1950, pp. 1-20, Milpitas, CA, USA.
Linear Technology, Power Factor Controller, Linear Technology Corporation, Data Sheet LT1248, pp. 1-12, Milpitas, CA, USA.
Supertex, Inc., HV9931 Unity Power Factor LED Lamp Driver, Supertex, Inc., Application Note AN-H52, 2007, pp. 1-20, Sunnyvale, CA, USA.
Ben-Yaakov, et al, The Dynamics of a PWM Boost Converter with Resistive Input, IEEE Transactions on Industrial Electronics, vol. 46., No. 3, Jun. 1999, pp. 1-8, Negev, Beer-Sheva, Israel.
Erickson, Robert W., et al, Fundamentals of Power Electronics, Second Edition, Chapter 6, 2001, pp. 131-184, Boulder CO, USA.
Stmicroelectronics, CFL/TL Ballast Driver Preheat and Dimming L6574, Sep. 2003, pp. 1-10, Geneva, Switzerland.
Fairchild Semiconductor, 500W Power-Factor-Corrected (PFC) Converter Design with FAN4810, Application Note 6004, Rev. 1.0.1, Oct. 31, 2003, pp. 1-14, San Jose, CA, USA.
Fairfield Semiconductor, Power Factor Correction (PFC) Basics, Application Note 42047, Rev. 0.9.0, Aug. 19, 2004, pp. 1-11, San Jose, CA, USA.
Fairchild Semiconductor, Design of Power Factor Correction Circuit Using FAN7527B, Application Note AN4121, Rev. 1.0.1, May 30, 2002, pp. 1-12, San Jose, CA, USA.
Fairchild Semiconductor, Low Start-Up Current PFC/PWM Controller Combos FAN4800, Rev. 1.0.6, Nov. 2006, pp. 1-20, San Jose, CA, USA.
Prodic, Aleksander, Compensator Design and Stability Assessment for Fast Voltage Loops of Power Factor Correction Rectifiers, IEEE Transactions on Power Electronics, vol. 22, Issue 5, Sep. 2007, pp. 1719-1730, Toronto, Canada.
Fairchild Semiconductor, ZVS Average Current PFC Controller FAN 4822, Rev. 1.0.1, Aug. 10, 2001, pp. 1-10, San Jose, CA, USA.
Prodic, et al, Dead-Zone Digital Controller for Improved Dynamic Response of Power Factor Preregulators, Applied Power Electronics Conference and Exposition, 2003, vol. 1, pp. 382-388, Boulder CA, USA.
Philips Semiconductors, 90W Resonant SMPS with TEA 1610 Swing Chip, Application Note AN99011, Sep. 14, 1999, pp. 1-28, The Netherlands.
Fairchild Semiconductor, Power Factor Correction Controller FAN7527B, Aug. 16, 2003, pp. 1-12, San Jose, CA, USA.
On Semiconductor, Power Factor Controller for Compact and Robust, Continuous Conduction Mode Pre-Converters, NCP1654, Mar. 2007, Rev. PO, pp. 1-10, Denver, CO, USA.
Fairchild Semicondctor, Simple Ballast Controller, KA7541, Rev. 1.0.3, Sep. 27, 2001, pp. 1-14, San Jose, CA, USA.
Fairchild Semiconductor, Power Factor Controller, ML4812, Rev. 1.0.4, May 31, 2001, pp. 1-18, San Jose, CA, USA.
Prodic, et al, Digital Controller for High-Frequency Rectifiers with Power Factor Correction Suitable for On-Chip Implementation, Power Conversion Conference-Nagoya, 2007. PCC '07, Apr. 2-5, 2007, pp. 1527-1531, Toronto, Canada.
Freescale Semiconductor, Dimmable Light Ballast with Power Factor Correction, Designer Reference Manual, DRM067, Rev. 1, Dec. 2005, M68HC08 Microcontrollers, pp. 1-72, Chandler, AZ, USA.
Freescale Semiconductor, Design of Indirect Power Factor Correction Using 56F800/E, Freescale Semiconductor Application Note, AN1965, Rev. 1, Jul. 2005, pp. 1-20, Chandler, AZ, USA.
Freescale Semiconductor, Implementing PFC Average Current Mode Control using the MC9S12E128, Application Note AN3052, Addendum to Reference Design Manual DRM064, Rev. 0, Nov. 2005, pp. 1-8, Chandler, AZ, USA.
Hirota, et al, Analysis of Single Switch Delta-Sigma Modulated Pulse Space Modulation PFC Converter Effectively Using Switching Power Device, Power Electronics Specialists Conference, 2002. pesc 02. 2002 IEEE 33rd Annual, vol. 2, pp. 682-686, Hyogo Japan.
Madigan, et al, Integrated High-Quality Rectifier-Regulators, Industrial Electronics, IEEE Transactions, vol. 46, Issue 4, pp. 749-758, Aug. 1999, Cary, NC, USA.
Renesas, Renesas Technology Releases Industry's First Critical-Conduction-Mode Power Factor Correction Control IC Implementing Interleaved Operations, R2A20112, pp. 1-4, Dec. 18, 2006, Tokyo, Japan.
Renesas, PFC Control IC R2A20111 Evaluation Board, Application Note R2A20111 EVB, all pages, Feb. 2007, Rev. 1.0, pp. 1-39, Tokyo, Japan.
Miwa, et al, High Efficiency Power Factor Correction Using Interleaving Techniques, Applied Power Electronics Conference and Exposition, 1992. APEC '92. Conference Proceedings 1992., Seventh Annual, Feb. 23-27, 1992, pp. 557-568, MIT, Cambridge, MA, USA.
Noon, Jim, High Performance Power Factor Preregulator UC3855A!B, Texas Instruments Application Report, SLUA146A, May 1996—Revised Apr. 2004, pp. 1-35, Dallas TX, USA.
NXP Semiconductors, TEA1750, GreenChip III Smps Control IC Product Data Sheet, Rev.01, Apr. 6, 2007, pp. 1-29, Eindhoven, The Netherlands.
Turchi, Joel, Power Factor Correction Stages Operating in Critical Conduction Mode, ON Semiconductor, Application Note AND8123/D, Sep. 2003—Rev. 1, pp. 1-20, Denver, CO, USA.
On Semiconductor, Greenline Compact Power Factor Controller: Innovative Circuit for Cost Effective Solutions, MC33260, Semiconductor Components Industries, Sep. 2005—Rev. 9, pp. 1-22, Denver, CO, USA.
On Semiconductor, Enhanced, High Voltage and Efficient Standby Mode, Power Factor Controller, NCP1605, Feb. 2007, Rev. 1, pp. 1-32, Denver, CO, USA.
On Semiconductor, Cost Effective Power Factor Controller, NCP1606, Mar. 2007, Rev. 3, pp. 1-22, Denver, CO, USA.
Renesas, Power Factor Correction Controller IC, HA16174P/FP, Rev. 1.0, Jan. 6, 2006, pp. 1-38, Tokyo, Japan.

(56) References Cited

OTHER PUBLICATIONS

Seidel, et al, A Practical Comparison Among High-Power-Factor Electronic Ballasts with Similar Ideas, IEEE Transactions on Industry Applications, vol. 41, No. 6, Nov./Dec. 2005, pp. 1574-1583, Santa Maria, Brazil.
Stmicroelectronics, Electronic Ballast with PFC using L6574 and L6561. Application Note AN993, May 2004, pp. 1-20, Geneva, Switzerland.
Stmicroelectronics, Advanced Transition-Mode PFC Controller L6563 and L6563A, Mar. 2007, pp. 1-40, Geneva, Switzerland.
Su, et al, "Ultra Fast Fixed-Frequency Hysteretic Buck Converter with Maximum Charging Current Control and Adaptive Delay Compensation for DVS Applications", IEEE Journal of Solid-State Circuits, vol. 43, No. 4, Apr. 2008, pp. 815-822, Hong Kong University of Science and Technology, Hong Kong, China.
Wong, et al, "Steady State Analysis of Hysteretic Control Buck Converters", 2008 13th International Power Electronics and Motion Control Conference (EPE-PEMC 2008), pp. 400-404, 2008, National Semiconductor Corporation, Power Management Design Center, Hong Kong, China.
Zhao, et al, Steady-State and Dynamic Analysis of a Buck Converter Using a Hysteretic PWM Control, 2004 35th Annual IEEE Power Electronics Specialists Conference, pp. 3654-3658, Department of Electrical & Electronic Engineering, Oita University, 2004, Oita, Japan.
International Search Report, PCT/US2012/069942, European Patent Office, Jul. 21, 2014, pp. 1-5.
Written Opinion, PCT/US2012/069942, European Patent Office, Jul. 21, 2014, pp. 1-8.
International Search Report, PCT/US2014/021921, European Patent Office, Jun. 23, 2014, pp. 1-3.
Written Opinion, PCT/US2014/021921, European Patent Office, Jun. 23, 2014, pp. 1-5.
Severns, A New Improved and Simplified Proportional Base Drive Circuit, Proceedings of PowerCon 6, May 1979.
Ivanovic, Zelimir, "A low consumption proportional base drive circuit design for switching transistors", Proceedings of the Fifth International PCI '82 Conference: Sep. 28-30, 1982, Geneva, Switzerland.
Bell, David, "Designing optimal base drive for high voltage switching transistors", Proceeding of PowerCon7, 1980.
Marcelo Godoy Simões, "Power Bipolar Transistors", Chapter 5, Academic Press 2001, pp. 63-74.
Varga, L.D. and Losic, N.A., "Design of a high-performance floating power BJT driver with proportional base drive," Industry Applications Society Annual Meeting, 1989., Conference Record of the Oct. 1-5, 1989, IEEE, vol. I, pp. I186, 1189.
Skanadore, W.R., "Toward an understanding and optimal utilization of third-generation bipolar switching transistors", 1982 IEEE.
IC datasheet STR-S6707 through STR-S6709 by Sanken, copyright 1994, Allegro MicroSystems, Inc.
Avant et al., "Analysis of magnetic proportional drive circuits for bipolar junction transistors" PESC 1985, pp. 375-381.

\* cited by examiner

TWO TERMINAL DRIVE OF BIPOLAR JUNCTION TRANSISTOR (BJT) OF A LIGHT EMITTING DIODE (LED)-BASED BULB

CROSS-REFERENCE TO RELATED APPLICATIONS

This application claims the benefit of priority of U.S. Provisional Patent Application No. 61/859,638 to Melanson et al. filed on Jul. 29, 2013 and entitled "Bipolar Junction Transistor (BJT) based efficient DC-DC conversion with accurate output current regulation" and claims the benefit of priority of U.S. Provisional Patent Application No. 61/889,101 to Dutta et al. filed on Oct. 10, 2013 and entitled "Adaptive Gain Proportional Base Drive Control Based on Internal Current Sense," both of which are incorporated by reference.

This application is related by subject matter to U.S. patent application Ser. No. 14/280,539 to John Melanson et al. filed May 16, 2014 and entitled "Charge Pump-Based Drive Circuitry for Bipolar Junction Transistor (BJT)-based Power Supply" and is related by subject matter to U.S. patent application Ser. No. 14/280,474 to Ramin Zanbaghi et al. filed May 16, 2014 and entitled "Single Pin Control of Bipolar Junction Transistor (BJT)-based Power Stage," and is related by subject matter to U.S. patent application Ser. No. 14/341,984 to Melanson et al. filed Jul. 28, 2014, and entitled "Compensating for a Reverse Recovery Time Period of the Bipolar Junction Transistor (BJT) in Switch-Mode Operation of a Light-Emitting Diode (LED)-based Bulb," and is related by subject matter to U.S. patent application Ser. No. 13/715,914 to Siddharth Maru filed Dec. 14, 2012 and entitled "Multi-Mode Flyback Control For a Switching Power Converter," each of which is incorporated by reference.

FIELD OF THE DISCLOSURE

The instant disclosure relates to power supply circuitry. More specifically, this disclosure relates to power supply circuitry for lighting devices.

BACKGROUND

Alternative lighting devices to replace incandescent light bulbs differ from incandescent light bulbs in the manner that energy is converted to light. Incandescent light bulbs include a metal filament. When electricity is applied to the metal filament, the metal filament heats up and glows, radiating light into the surrounding area. The metal filament of conventional incandescent light bulbs generally has no specific power requirements. That is, any voltage and any current may be applied to the metal filament, because the metal filament is a passive device. Although the voltage and current need to be sufficient to heat the metal filament to a glowing state, any other characteristics of the delivered energy to the metal filament do not affect operation of the incandescent light bulb. Thus, conventional line voltages in most residences and commercial buildings are sufficient for operation of the incandescent bulb.

However, alternative lighting devices, such as compact fluorescent light (CFL) bulbs and light emitting diode (LED)-based bulbs, contain active elements that interact with the energy supply to the light bulb. These alternative devices are desirable for their reduced energy consumption, but the alternative devices have specific requirements for the energy delivered to the bulb. For example, compact fluorescent light (CFL) bulbs often have an electronic ballast designed to convert energy from a line voltage to a very high frequency for application to a gas contained in the CFL bulb, which excites the gas and causes the gas to glow. In another example, light emitting diode (LEDs)-based bulbs include a power stage designed to convert energy from a line voltage to a low voltage for application to a set of semiconductor devices, which excites electrons in the semiconductor devices and causes the semiconductor devices to glow. Thus, to operate either a CFL bulb or LED-based bulb, the line voltage must be converted to an appropriate input level for the lighting device of a CFL bulb or LED-based bulb. Conventionally, a power stage is placed between the lighting device and the line voltage to provide this conversion. Although a necessary component, this power stage increases the cost of the alternate lighting device relative to an incandescent bulb.

One conventional power stage configuration is the buck-boost power stage. FIG. 1 is a circuit schematic showing a buck-boost power stage for a light-emitting diode (LED)-based bulb. An input node 102 receives an input voltage, such as line voltage, for a circuit 100. The input voltage is applied across an inductor 104 under control of a switch 110 coupled to ground. When the switch 110 is activated, current flows from the input node 102 to the ground and charges the inductor 104. A diode 106 is coupled between the inductor 104 and light emitting diodes (LEDs) 108. When the switch 110 is deactivated, the inductor 104 discharges into the light emitting diodes (LEDs) 108 through the diode 106. The energy transferred to the light emitting diodes (LEDs) 108 from the inductor 104 is converted to light by LEDs 108.

The conventional power stage configuration of FIG. 1 provides limited control over the conversion of energy from a source line voltage to the lighting device. The only control available is through operation of the switch 110 by a controller. However, that controller would require a separate power supply or power stage circuit to receive a suitable voltage supply from the line voltage. Additionally, the switch 110 presents an additional expense to the light bulb containing the power stage. Because the switch 110 is coupled to the line voltage, which may be approximately 120-240 Volts RMS with large variations, the switch 110 must be a high voltage switch, which are large, difficult to incorporate into small bulbs, and expensive.

Shortcomings mentioned here are only representative and are included simply to highlight that a need exists for improved power stages, particularly for lighting devices and consumer-level devices. Embodiments described here address certain shortcomings but not necessarily each and every one described here or known in the art.

SUMMARY

A bipolar junction transistor (BJT) may be used as a switch for controlling a power stage of a lighting device, such as a light-emitting diode (LED)-based light bulb. Bipolar junction transistors (BJTs) may be suitable for high voltage applications, such as for use in the power stage and for coupling to a line voltage. Further, bipolar junction transistors (BJTs) are lower cost devices than conventional high voltage field effect transistors (HV FETs). Thus, implementations of power stages having bipolar junction transistor (BJT) switches may be lower cost than power stage implementations having field effect transistor (FET) switches.

However, BJTs have some drawbacks to use in power stages. For example, a base current must be supplied to the BJT to maintain the BJT in a conduction state. In some situations, the base current must be at least as high as 1/β of a peak collector current of the BJT, where β is a characteristic of the BJT. As another example, the transition time to turn off the BJT is longer than HV FETs, leading to high switching losses that increase proportional to an operational frequency of the BJT. Power BJTs for power stage applications in particular may have a low β leading to the base current for the BJT being a significant portion of power loss in the power stage. The switching time, base current requirement, and power loss must be addressed to allow the use of BJTs in power stages, particularly for alternative lighting devices.

In some embodiments, the BJT may be controlled from an integrated circuit (IC) device coupled to two terminals of the BJT. For example, the control IC may be coupled to a base and an emitter of the BJT. Through the two terminals, the control IC may regulate energy transfer from an input line voltage to a load by controlling operation of the BJT. In certain embodiments, the control IC may dynamically adjust a reverse recovery time period of the BJT through the two terminal connections. Adjusting the reverse recovery time period may allow a reduction in turn-off time of the BJT to within specified thresholds. Further, the dynamic adjustment of the reverse recovery time may allow the control IC to control other operations in the power stage, such as charging of a supply capacitor for the control IC. Additionally through the two terminals, the control IC may regulate a base current provided to the BJT. The base current may be regulated to be proportional to the collector current through the BJT to reduce base power dissipation, to reduce strain on the system supply, to provide a pulsed base current to provide fast turn-on of the BJT, and to reduce the turn-off time of the BJT by reducing excess base charge on the BJT.

According to one embodiment, a method may include driving a base current from a base current source to a base of the bipolar junction transistor (BJT) to maintain conduction of the bipolar junction transistor (BJT) during a first time period; disconnecting the base current source from the bipolar junction transistor (BJT) for a second time period; repeating the steps of driving the base current during the first time period and disconnecting the base current source for the second time period to obtain an average current output to a load; and/or dynamically adjusting the base current output from the base current source to adjust a reverse recovery time period of the bipolar junction transistor (BJT).

In some embodiments, the method may also include charging an energy storage device during a first portion of the reverse recovery time period, dynamically adjusting the charge portion of the reverse recovery time period to obtain a desired supply for the energy storage device, dynamically adjusting a second portion of the reverse recovery time period to a time between a low threshold and a high threshold; applying a suitable negative voltage across a base-emitter junction of the bipolar junction transistor (BJT) while applying the negative base current; determining the reverse recovery time period by measuring a parameter of the bipolar junction transistor (BJT), wherein the step of dynamically adjusting the base current output is based, at least in part, on the determined reverse recovery time period; delaying, for a first portion of the reverse recovery period, to allow charging of an energy storage device during the first portion of the reverse recovery time period; and/or coupling a negative base current source to the base of the bipolar junction transistor (BJT) for a second portion of the reverse recovery period after the first portion to drain excess base charge from the bipolar junction transistor (BJT).

In certain embodiments, the step of dynamically adjusting the base current may include dynamically adjusting the base current such that the base current is proportional to a collector current of the BJT; the step of controlling the base current output may include adjusting at least one of an initial base current pulse width, an initial base current pulse amplitude, an initial current for a ramp, and a base current ramp rate to control an amount of charge stored at the base of the bipolar junction transistor (BJT) at the end of the first time period; the step of dynamically adjusting may include maintaining the reverse recovery time period between a low threshold and a high threshold; the step of dynamically adjusting the base current may include controlling a negative base current after disconnecting the base current source, wherein the negative base current is proportional to a peak collector current of the bipolar junction transistor (BJT); the step of determining the reverse recovery time period may include measuring at least one of a voltage and a current at a base of the bipolar junction transistor (BJT); the step of determining the reverse recovery time period may include measuring a voltage of at least one of an emitter and a collector of the bipolar junction transistor (BJT); and/or the step of dynamically adjusting the first portion may include adjusting the first portion to zero.

According to another embodiment, an apparatus may include a controller configured to couple to a base and to an emitter of a bipolar junction transistor (BJT), wherein the controller is configured to perform the steps of: driving a base current from a base current source to a base of the bipolar junction transistor (BJT) to maintain conduction of the bipolar junction transistor (BJT) during a first time period; disconnecting the base current source from the bipolar junction transistor (BJT) for a second time period; repeating the steps of driving the base current during the first time period and disconnecting the base current source for the second time period to obtain an average current output to a load; and/or dynamically adjusting the base current output from the base current source to adjust a reverse recovery time period of the bipolar junction transistor (BJT).

In some embodiments, the controller may also be configured to perform the steps of charging an energy storage device during a first portion of the reverse recovery time period; dynamically adjusting the charge portion of the reverse recovery time period to obtain a desired supply for the energy storage device; dynamically adjusting a second portion of the reverse recovery time period to a time between a low threshold and a high threshold; applying a suitable negative voltage across a base-emitter junction of the bipolar junction transistor (BJT) while applying the negative base current; delaying, for a first portion of the reverse recovery period, to allow charging of an energy storage device during the first portion of the reverse recovery time period; and/or coupling a negative base current source to the base of the bipolar junction transistor (BJT) for a second portion of the reverse recovery period after the first portion to drain excess base charge from the bipolar junction transistor (BJT).

In certain embodiments, the step of dynamically adjusting the base current may include dynamically adjusting the base current such that the base current is proportional to a collector current of the BJT; the step of controlling the base current output may include adjusting at least one of an initial base current pulse width, an initial base current pulse amplitude, an initial current for a ramp, and a base current ramp rate to control an amount of charge stored at the base of the bipolar junction transistor (BJT) at the end of the first time period; the step of dynamically adjusting the first time period duration may include maintaining a reverse recovery time period between a low threshold and a high threshold; the step of dynamically adjusting the base current may include applying a negative base current after disconnecting the base current source, wherein the negative base current is proportional to a peak collector current of the bipolar junction transistor (BJT); and/or the step of dynamically adjusting the first portion may include adjusting the first portion to zero.

According to a further embodiment, an integrated circuit (IC) may include a base current source configured to be coupled to the base of the bipolar junction transistor (BJT) through a first base switch; and/or a controller coupled to the base current source and configured to couple to an emitter switch coupled to an emitter of the bipolar junction transistor (BJT), wherein the controller is configured to perform the steps of: driving a base current from a base current source to a base of the bipolar junction transistor (BJT) to maintain conduction of the bipolar junction transistor (BJT) during a first time period; disconnecting the base current source from the bipolar junction transistor (BJT) for a second time period; repeating the steps of driving the base current during the first time period and disconnecting the base current source for the second time period to obtain an average current output to a load; and/or dynamically adjusting the base current output from the base current source to adjust a reverse recovery time period of the bipolar junction transistor (BJT).

In certain embodiments, the integrated circuit may also include a base sense amplifier coupled to the variable resistor and to the controller, wherein the controller may be configured to dynamically adjust the variable resistor based, at least in part, on an output of the base sense amplifier; an emitter sense amplifier configured to be coupled to an emitter switch coupled to the emitter of the bipolar junction transistor (BJT), wherein the controller may be further configured to couple to the emitter switch; a second base current source configured to couple to the base of the bipolar junction transistor; a third base switch coupled to the second base current source and to a ground; and/or a variable resistor configured to be coupled to the base of the bipolar junction transistor (BJT) through a second base switch.

In some embodiments, the controller may also be configured to perform the steps of repeating to obtain an average current output to a plurality of light emitting diodes (LEDs); switching on the emitter switch during the first time period; switching off the emitter switch during the second time period; determining the collector current of the bipolar junction transistor (BJT) based, at least in part, on an output of the emitter sense amplifier; adjusting the base current output is based, at least in part, on the determined collector current; switching on the third base switch after the first time period; and/or dynamically adjusting the second base current source to adjust the reverse recovery time period of the bipolar junction transistor (BJT).

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims.

Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

A bipolar junction transistor (BJT) may control delivery of power to a lighting device, such as light emitting diodes (LEDs). The bipolar junction transistor (BJT) may be coupled to a high voltage source, such as a line voltage, and may control delivery of power to the LEDs. The bipolar junction transistor (BJT) is a low cost device that may reduce the price of alternative light bulbs. In some embodiments, a controller for regulating energy transfer from an input voltage, such as a line voltage, to a load, such as the LEDs, may be coupled to the BJT through two terminals. For example, the controller may regulate energy transfer by coupling to a base of the BJT and an emitter of the BJT. The controller may both obtain input from the base and/or emitter of the BJT and apply control signals to a base and/or emitter of the BJT.

Figure 1:
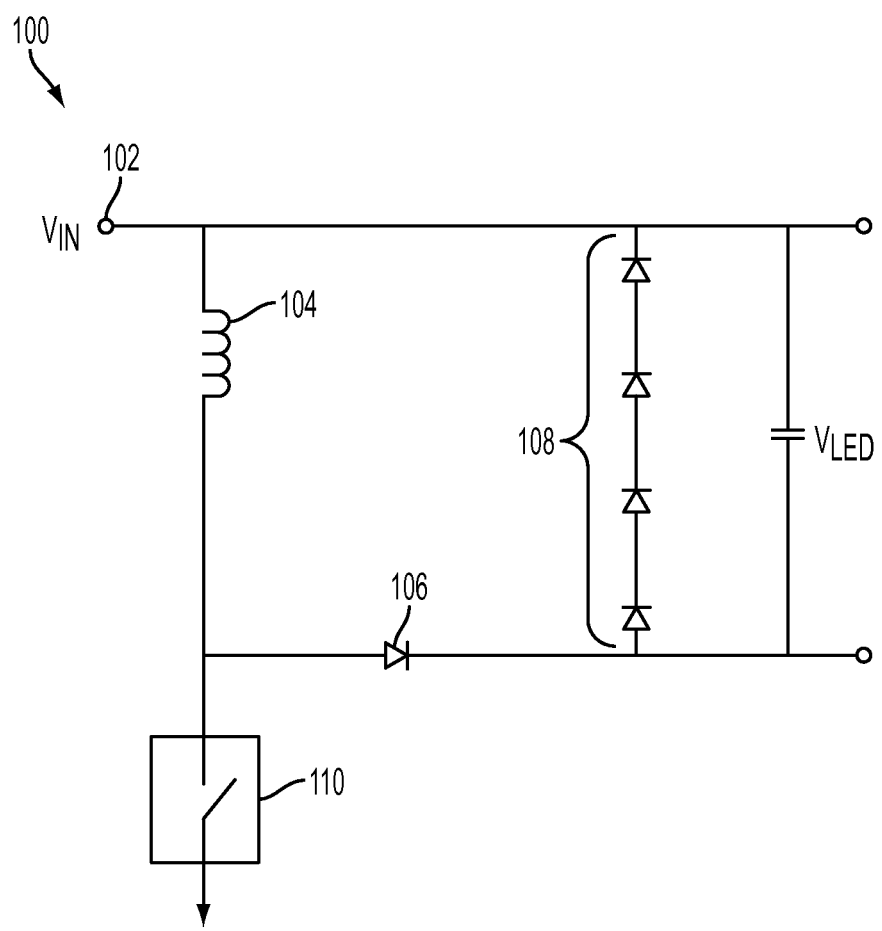
FIG. 1 is a circuit schematic illustrating a buck-boost power stage for a light-emitting diode (LED)-based bulb in accordance with the prior art.
Figure 2:
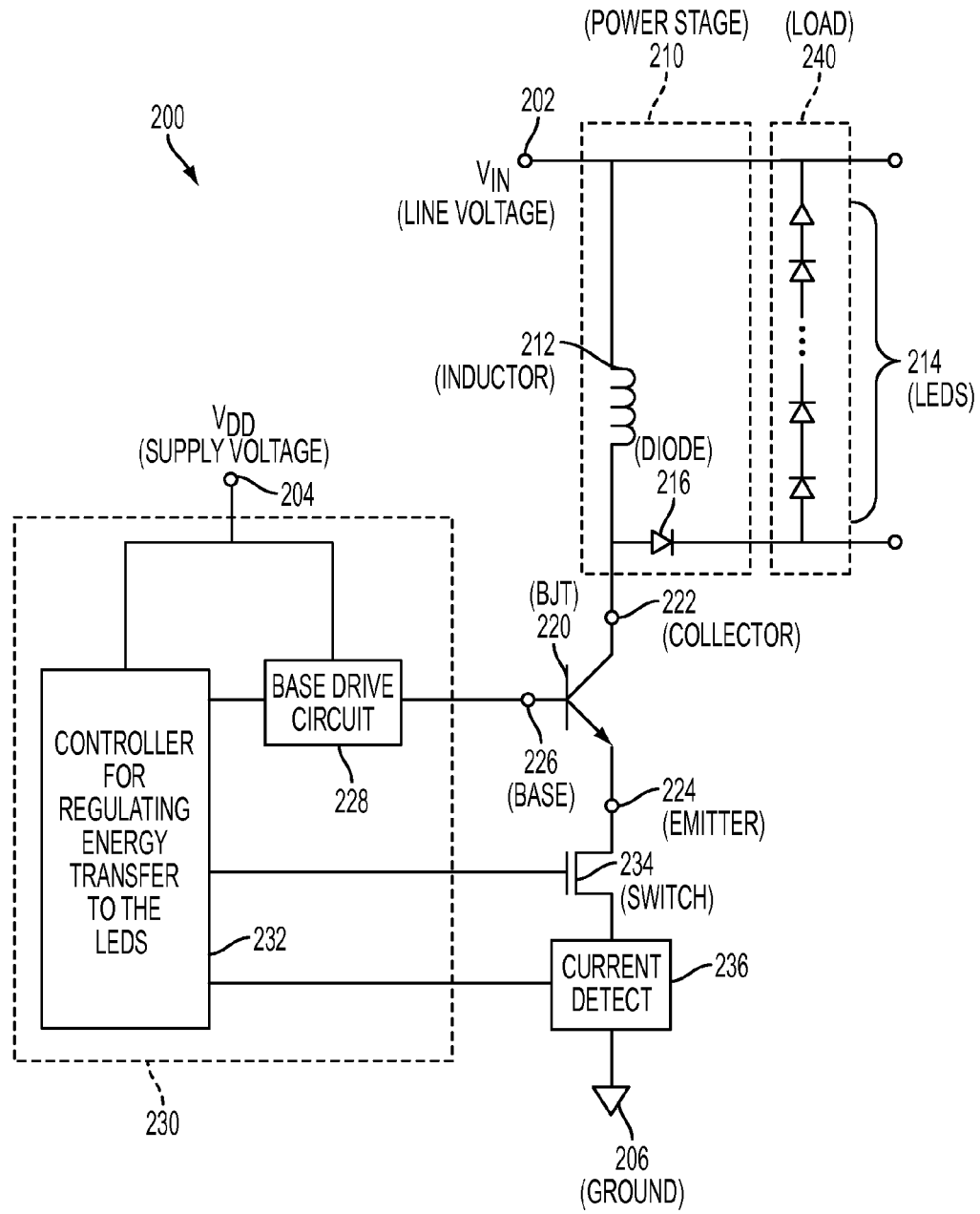
FIG. 2 is a circuit schematic illustrating a power stage having an emitter-controlled bipolar junction transistor (BJT) according to one embodiment of the disclosure.

FIG. 2 is a circuit schematic illustrating a power stage having an emitter-controlled bipolar junction transistor (BJT) according to one embodiment of the disclosure. A circuit 200 may include a bipolar junction transistor (BJT) 220 having a collector node 222, an emitter node 224, and a base node 226. The collector 222 may be coupled to a high voltage input node 202 and a lighting load 214, such as a plurality of light emitting diodes (LEDs). An inductor 212 and a diode 216 may be coupled between the high voltage input node 202 and the lighting load 214. The inductor 212 and the diode 216 and other components (not shown) may be part of a power stage 210. The LEDs 214 may generically be any load 240.

Figure 3:
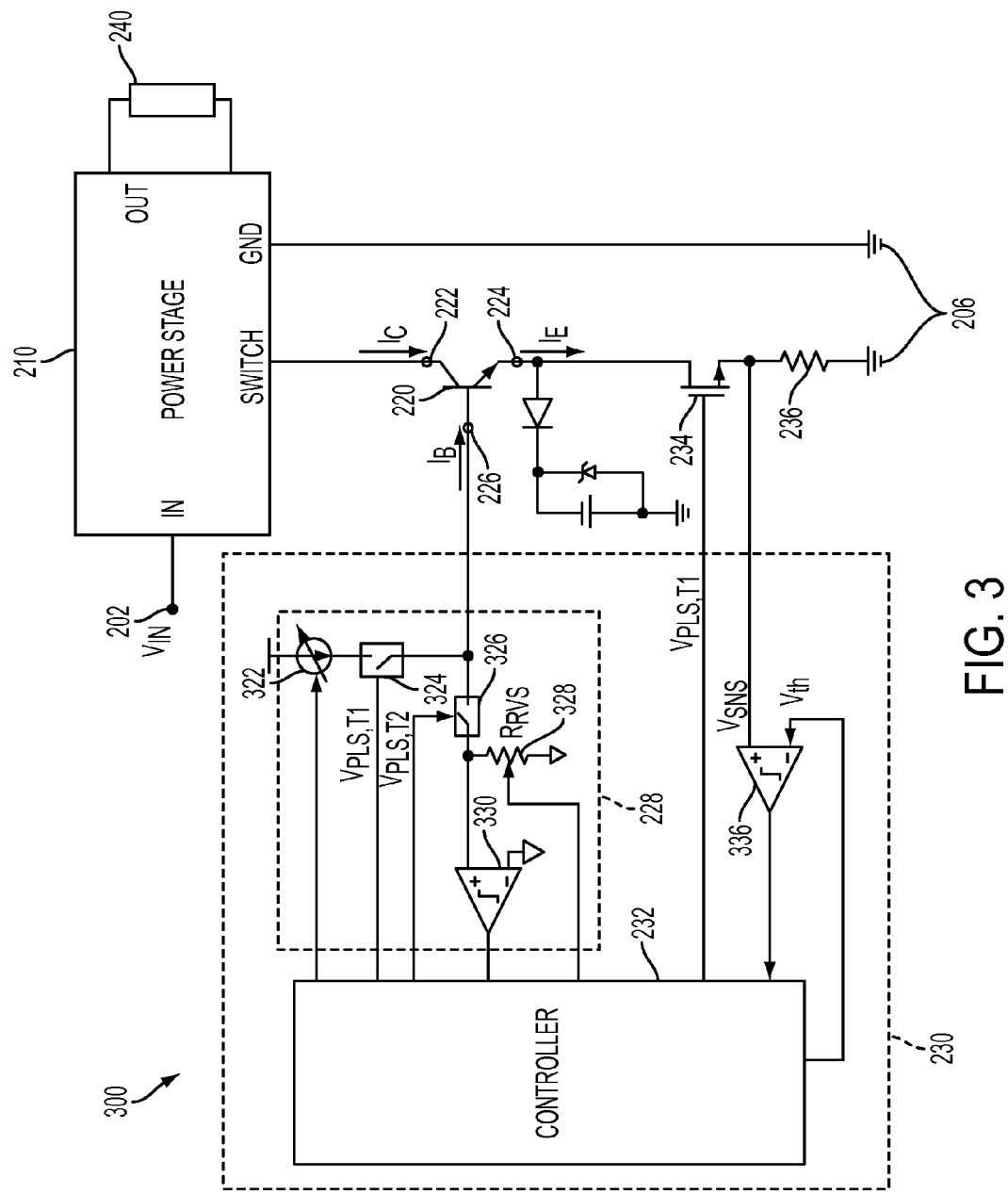
FIG. 3 is a circuit schematic illustrating control of a bipolar junction transistor (BJT) through two terminals according to one embodiment of the disclosure.

The emitter node 224 of the BJT 220 may be coupled to an integrated circuit (IC) 230 through a switch 234, and a current detect circuit 236. The switch 234 may be coupled in a current path from the emitter node 224 to a ground 206. The current detect circuit 236 may be coupled between the switch 234 and the ground 206. The controller 232 may control power transfer from the input node 202 to the lighting load 214 by operating the switch 234 to couple and/or disconnect the emitter node 224 of the BJT 220 to the ground 206. The current detect circuit 236 may provide feedback to the controller 232 regarding current flowing through the BJT 220 while the switch 234 is turned on to couple the emitter node 224 to the ground 206. As shown in FIG. 3, the switch 234 and the current detect circuit 236, such as a resistor 236 are not part of the IC 230. In another embodiment, the switch 234 and the resistor 236 may be part of the IC 230 and integrated with the controller 232 and other components shown in FIG. 3.

The base node 226 of the BJT 220 may also be coupled to the IC 230, such as through a base drive circuit 228. The base drive circuit 228 may be configured to provide a relatively fixed bias voltage to the base node 226 of the BJT 220, such as during a time period when the switch 234 is switched on. The base drive circuit 228 may also be configured to dynamically adjust base current to the BJT 220 under control of the controller 232. The base drive circuit 228 may be controlled to maintain conduction of the BJT 220 for a first time period. The base drive circuit 228 may be disconnected from the BJT 220 to begin a second flyback time period with the turning off of the BJT 220.

The controller 232 may control delivery of power to the lighting load 214 in part through the switch 234 at the emitter node 224 of the BJT 220. When the controller 232 turns on the switch 234, current flows from the high voltage input node 202, through the inductor 212, the BJT 220, and the switch 234, to the ground 206. During this time period, the inductor 212 charges from electromagnetic fields generated by the current flow. When the controller 232 turns off the switch 234, current flows from the inductor 212, through the diode 216, and through the lighting load 214 after a reverse recovery time period of the BJT 220 completes and a sufficient voltage accumulates at collector node 222 to forward bias diode 216 of the power stage 210. The lighting load 214 is thus powered from the energy stored in the inductor 212, which was stored during the first time period when the controller 232 turned on the switch 234. The controller 232 may repeat the process of turning on and off the switch 234 to control delivery of energy to the lighting load 214. Although the controller 232 operates switch 234 to start a conducting time period for the BJT 220 and to start a turn-off transition of the BJT 220, the controller 232 does not directly control conduction of the BJT 220. Control of delivery of energy from a high voltage source may be possible in the circuit 200 without exposing the IC 230 or the controller 232 to the high voltage source.

The controller 232 may decide the first duration of time to hold the switch 234 on and the second duration of time to hold the switch 234 off based on feedback from the current detect circuit 236. For example, the controller 232 may turn off the switch 234 after the current detect circuit 236 detects current exceeding a first current threshold. A level of current detected by the current detect circuit 236 may provide the controller 232 with information regarding a charge level of the inductor 212. By selecting the first duration of the time and the second duration of time, the controller 232 may regulate an average current output to the LEDs 214.

Additional details for one configuration of the IC 230 are shown in FIG. 3. FIG. 3 is a circuit schematic illustrating control of a bipolar junction transistor (BJT) through two terminals according to one embodiment of the disclosure. A circuit 300 may include, within the IC 230, a forward base current source 322 coupled to the base node 226 by a forward base switch 324. The current source 322 may provide a variable base current adjustable by the controller 232. The switch 324 may be switched on by the controller 232 with a control signal $V_{PLS,T1}$. The control signal $V_{PLS,T1}$ may also be applied to the switch 234 at the emitter of the BJT 220. As described above, the switch 234 is turned on to charge the power stage 210 during a first time period. The switch 324 may also be turned on during the same time period, and current from the source 322 applied to the BJT 220 to allow the BJT 220 to remain turned on and in a conducting state. In one embodiment, the controller 232 may also control the current source 322 to increase a base current to the BJT 220 proportional to an increase in collector current through the BJT 220. The $V_{PLS,T1}$ control signal may be generated by monitoring a current detect resistor 236 with an amplifier 336. For example, when the current sensed by resistor 236 reaches a threshold voltage, $V_{th}$, the amplifier 336 output may switch states and the controller 232 may then switch a state of the $V_{PLS,T1}$ control signal.

Figure 4:
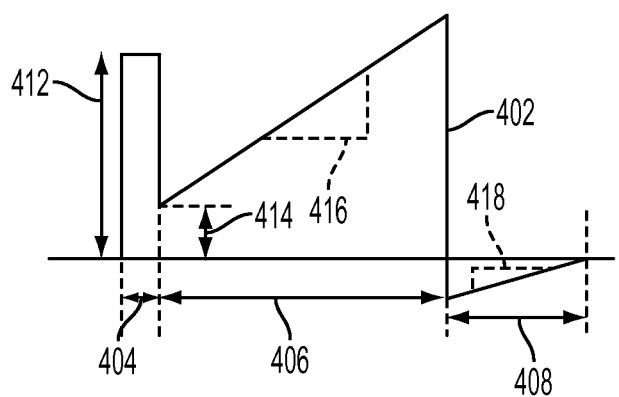
FIG. 4 is a graph illustrating a base current waveform applied to a bipolar junction transistor (BJT) according to one embodiment of the disclosure.

The base current applied to the base node 226 by the current source 322 may be controlled by the controller 232. One example of base current applied to the base node 226 is shown in FIG. 4. FIG. 4 is a graph illustrating a base current waveform applied to a bipolar junction transistor (BJT) according to one embodiment of the disclosure. A base current 402 may have an initial pulse period 404, followed by a ramp period 406. The controller 232 may control the current source 322 to vary, for example, a pulse height 412, a pulse width 404, and a ramp rate 416. The pulse period 404 may provide a quick turn-on of the BJT 220. The ramp rate 416 may be selected to maintain conduction and reduce excess base charge accumulation that results in long turn-off time of the BJT 220.

Referring back to FIG. 3, a reverse recovery time period may be monitored with a resistor 328. The resistor 328 may be coupled to the base node 226 through a switch 326. In some embodiments, the resistor 328 may be used to control a reverse base current from the base node 226. The resistor 328 may be a variable resistor to allow tuning of a reverse base current from the BJT 220. The resistor 328 may also be coupled to the base node 226 with the switch 326 to reduce the likelihood of the base node 226 floating and causing a breakdown of the BJT 220.

The resistor 328 may be used to measure a reverse base current from the BJT 220, and thus used to determine a duration of the reverse recovery time period. After the forward base current source 322 is disconnected from the BJT 220, a second time period begins. A portion of this second time period is a reverse recovery period during which base current flows from the BJT 220 until the BJT 220 turns off. The BJT 220 then remains turned off until the forward base current source 322 is again coupled to the base node 226. The switch 326 may be switched on during the second time period to allow sensing the end of the reverse recovery period. The switch 326 may be controlled through a control signal $V_{PLS,T2}$ generated by the controller 232. The control signal $V_{PLS,T2}$ may be generated by the controller 232 based, in part, on the output of a sense amplifier 330 coupled to the resistor 328. For example, the $V_{PLS,T2}$ signal may be switched to a high state when the $V_{PLS,T1}$ control signal switches to a low state, and the $V_{PLS,T2}$ signal may then be switched to a low state after the sense amplifier 330 indicates the reverse current reaches zero indicating the end of the reverse recovery time period.

Referring back to FIG. 4, the reverse recovery period is shown as time period 408. During time period 408, the base current is negative and a ramp rate 418 may be adjusted by the controller 232. When the base current reaches zero at the end of time period 408, the BJT 220 switches off and power is then discharged from the power stage 210 to the load 240.

Figure 5:
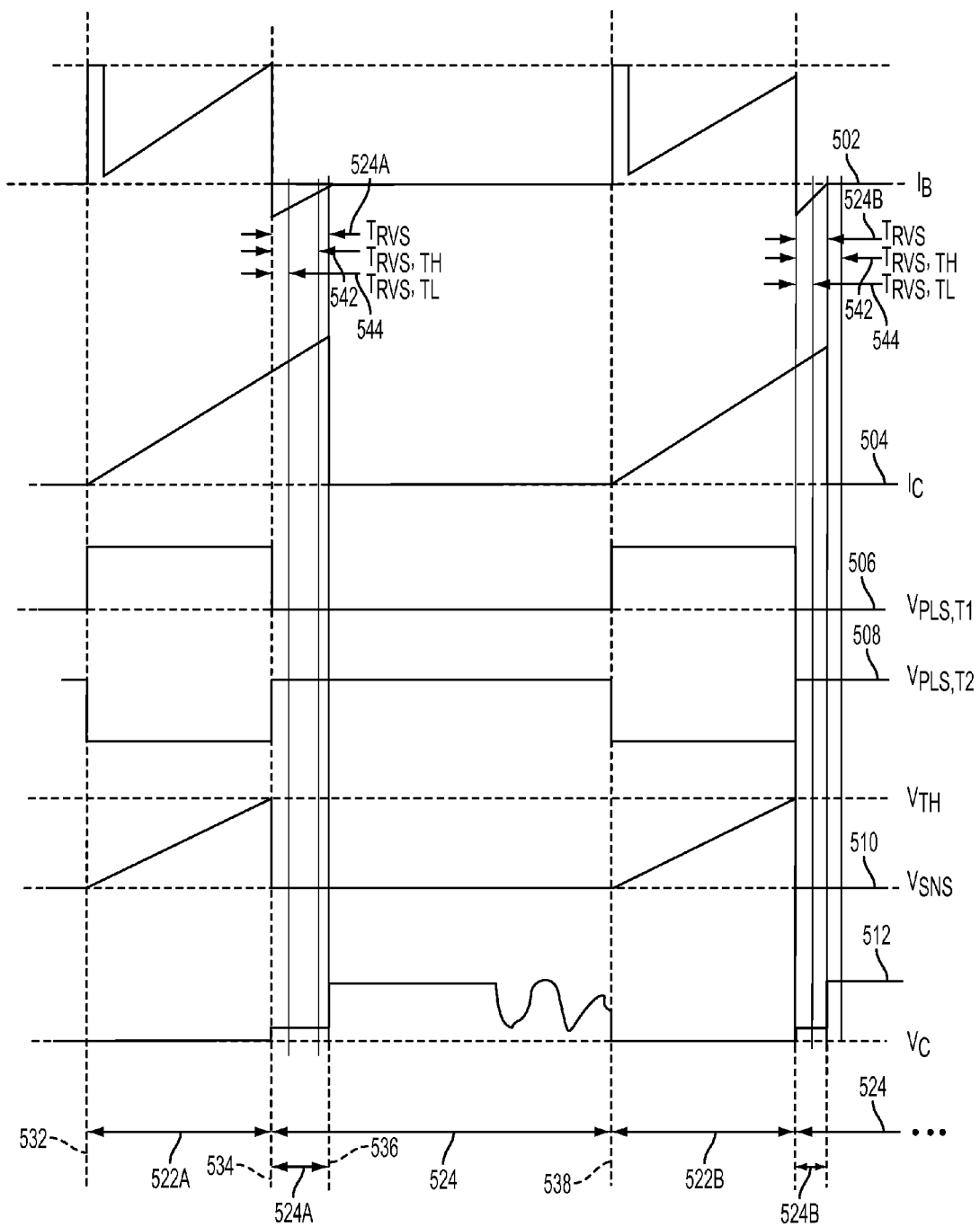
FIG. 5 are graphs illustrating dynamic adjustment of a reverse recovery period by a controller according to one embodiment of the disclosure.

An example operation of the controller 232 dynamically adjusting a base current output of the base source 322 is shown in FIG. 5. FIG. 5 are graphs illustrating dynamic adjustment of a reverse recovery period by a controller according to one embodiment of the disclosure. In FIG. 5, a base current $I_B$ applied to the BJT 220 is illustrated by a line 502, and a collector current $I_C$ through the BJT 220 is shown by a line 504. The collector current $I_C$ may be proportional to an emitter current sensed by resistor 236 while the switch 234 is turned on.

A first time period 522A begins at time 532 with a control signal $V_{PLS,T1}$ shown by line 506 switching to high. During time 522A, the base current 502 is applied to the BJT 220, including a pulse and a ramp, to start conduction resulting in an increasing collector current $I_C$ shown in line 504. The sense amplifier 336 receives an indication of the collector current $I_C$ as $V_{SNS}$. When $V_{SNS}$ reaches a threshold $V_{th}$, the amplifier 336 provides an indication to the controller 232 and the controller 232 switches the control signal $V_{PLS,T1}$ to low at time 534. Also at time 534, the controller 232 switches the control signal $V_{PLS,T2}$ to high to couple resistor 328 to the base node 226 of BJT 220. This begins a reverse recovery period 524A during which the base current $I_B$ is negative. A rate of decrease of the negative base current $I_B$ may be set by a resistance of the resistor 328 and controlled by the controller 232. During the reverse recovery time period 524A, the BJT 220 remains conducting and the collector current $I_C$ continues to increase. When the base current $I_B$ reaches zero, the BJT 220 turns off and the collector current $I_C$ goes to zero at time 536. The BJT 220 then remains off for the remaining duration of the second time period 524 until the controller 232 switches $V_{PLS,T1}$ to high and $V_{PLS,T2}$ to low to start another first time period 522B at time 538. The duration of the first time period 522A and the second time period 524 may be controlled by the controller 232 to maintain an average output current to the load 240.

When the first time period repeats as time period 522B, the controller 232 may dynamically adjust the base current $I_B$ shown in line 502. The reverse recovery time period 524A is shown to be longer than a high threshold $T_{rvs,th}$ 542 for the reverse recovery. Thus, the controller 232 may adjust a base current applied to the BJT 220 during time period 522B to reduce a subsequent reverse recovery time period 524B. The controller 232 may perform this adjustment with each repeat of the first and second time periods in order to maintain the reverse recovery time period between a high threshold $T_{rvs,th}$ 542 and a low threshold $T_{rvs,th}$ 544. Any of the pulse width, the pulse height, and the ramp rate of the base current $I_B$ during time period 522B may be adjusted. For example, a pulse width may be decreased and a ramp rate decreased to reduce the reverse recovery time period of 524B to between the high threshold $T_{rvs,th}$ 542 and the low threshold $T_{rvs,th}$ 544. The controller 232 may also adjust a resistance of the resistor 328 to adjust a ramp rate during the reverse recovery time period 524B to adjust the duration of the reverse recovery time period 524B.

Figure 6:
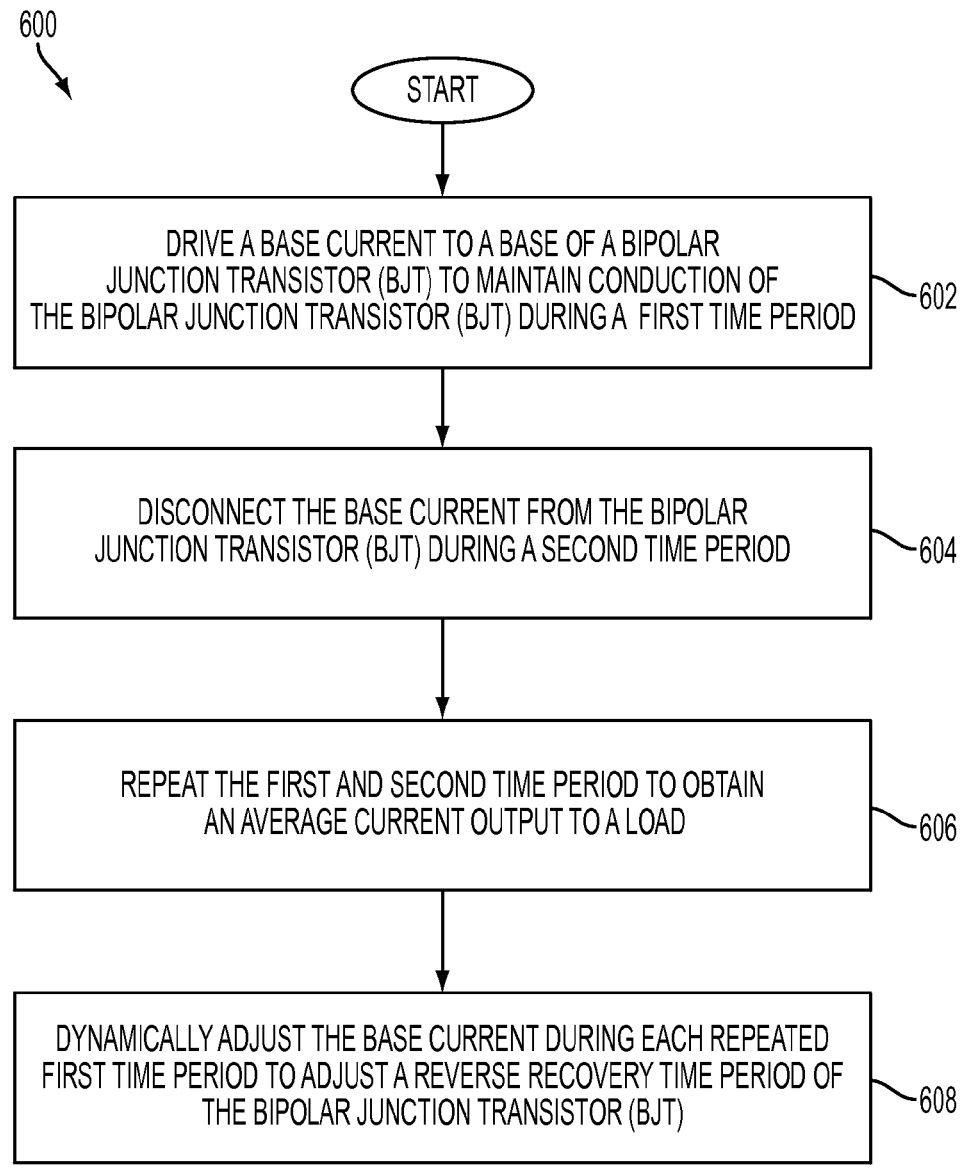
FIG. 6 is a flow chart illustrating a method of adjusting a reverse recovery time period by a controller coupled to a bipolar junction transistor (BJT) according to one embodiment of the disclosure.

The adjustment of a reverse recovery time period for a switch in a switch-mode power supply while delivering power to a load is illustrated in a flow chart of FIG. 6. FIG. 6 is a flow chart illustrating a method of adjusting a reverse recovery time period by a controller coupled to a bipolar junction transistor (BJT) according to one embodiment of the disclosure. A method 600 begins at block 602 with driving a base current from a base current source to a base of the bipolar junction transistor (BJT) to maintain conduction of the bipolar junction transistor (BJT) during a first time period. Block 602 may include, for example, generating a high $V_{PLS,T1}$ control signal and controlling the switch 324 and base current source 322. At block 604, the base current source may be disconnected from the bipolar junction transistor (BJT) for a second time period. Block 604 may include, for example, generating a low $V_{PLS,T1}$ signal and a high $V_{PLS,T2}$ signal and controlling the switch 326 and the resistor 328. At block 606, the steps of block 602 and block 604 are repeated to obtain an average current output to a load. Then, at block 608, a controller may dynamically adjust the base current output from the base current source at block 602 to adjust a reverse recovery time period of the bipolar junction transistor (BJT). Blocks 602 and 604 may continue to be repeated and the base current adjusted to deliver power to a load, such as light emitting diodes (LEDs) to generate a steady light from a light bulb.

Figure 7:
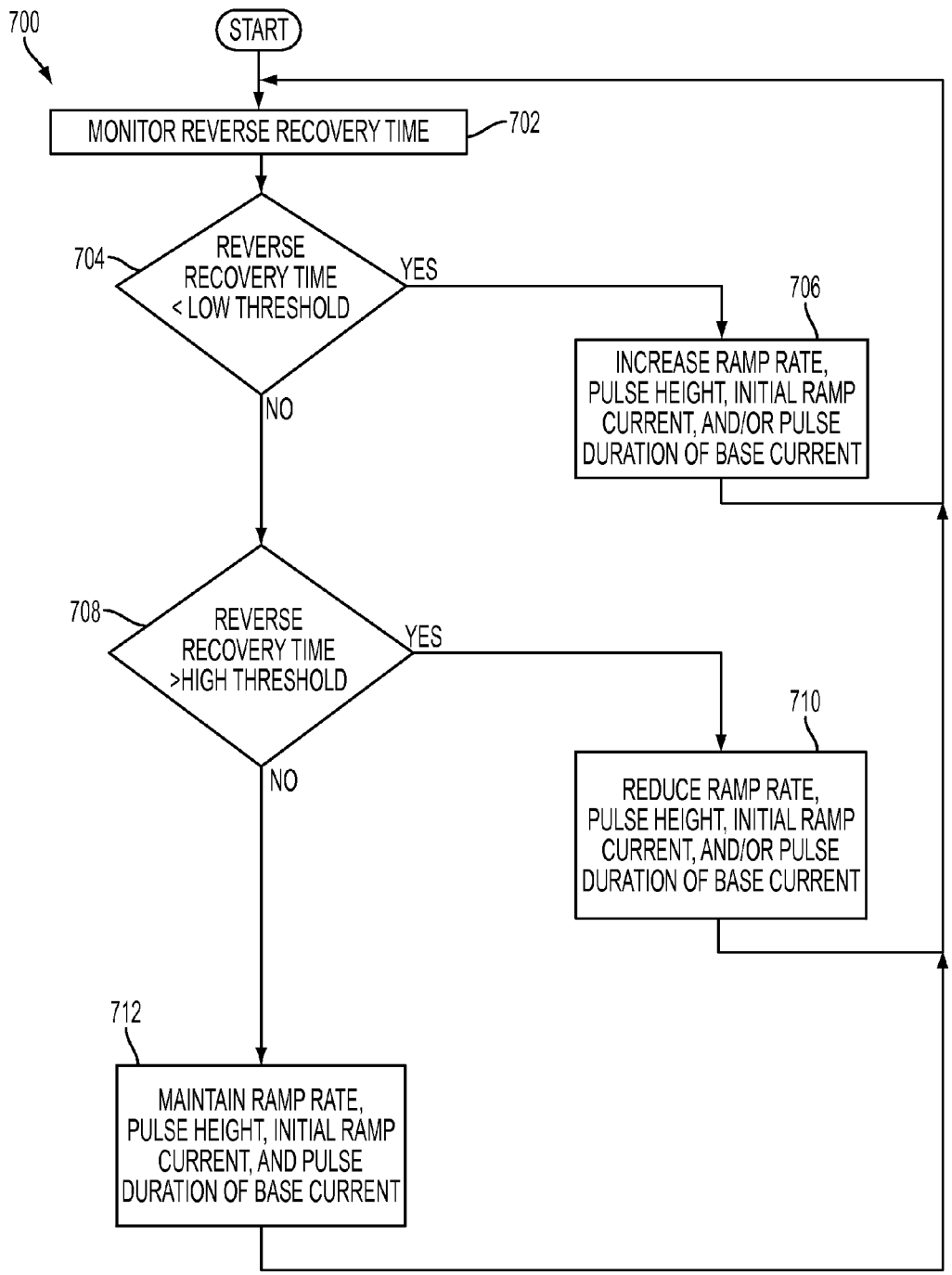
FIG. 7 is a flow chart illustrating monitoring and adjusting a reverse recovery time period by adjusting a base current to a bipolar junction transistor (BJT) according to one embodiment of the disclosure.

One method of adjusting the reverse recovery time period is shown in FIG. 7. FIG. 7 is a flow chart illustrating monitoring and adjusting a reverse recovery time period by adjusting a base current to a bipolar junction transistor (BJT) according to one embodiment of the disclosure. A method 700 begins at block 702 with monitoring a reverse recovery time. The reverse recovery time may be compared at block 704 to a low threshold, such as the $T_{rvs,t1}$ threshold 544 of FIG. 5. When the reverse recovery time is less than the low threshold, the method 700 proceeds to block 706 to increase a ramp rate, a pulse height, and/or a pulse duration of the base current. If the reverse recovery time is not less than the low threshold, the reverse recovery time is compared to a high threshold, such as the $T_{rvs,th}$ threshold 542 of FIG. 5, at block 708. If the reverse recovery time is greater than the high threshold, then the method 700 proceeds to block 710 to reduce a ramp rate, a pulse height, and/or a pulse duration of a base current at block 710. If the reverse recovery period is between the low and high thresholds, then the method 700 reaches block 712 to maintain the ramp rate, pulse height, and/or pulse duration of base current. In one embodiment, at block 712, these parameters may vary but be adjusted proportional to each other such that a similar amount of total base current is delivered to the bipolar junction transistor (BJT). The method of 700 may be repeated by the controller to continue dynamically adjusting the reverse recovery time period.

Figure 8:
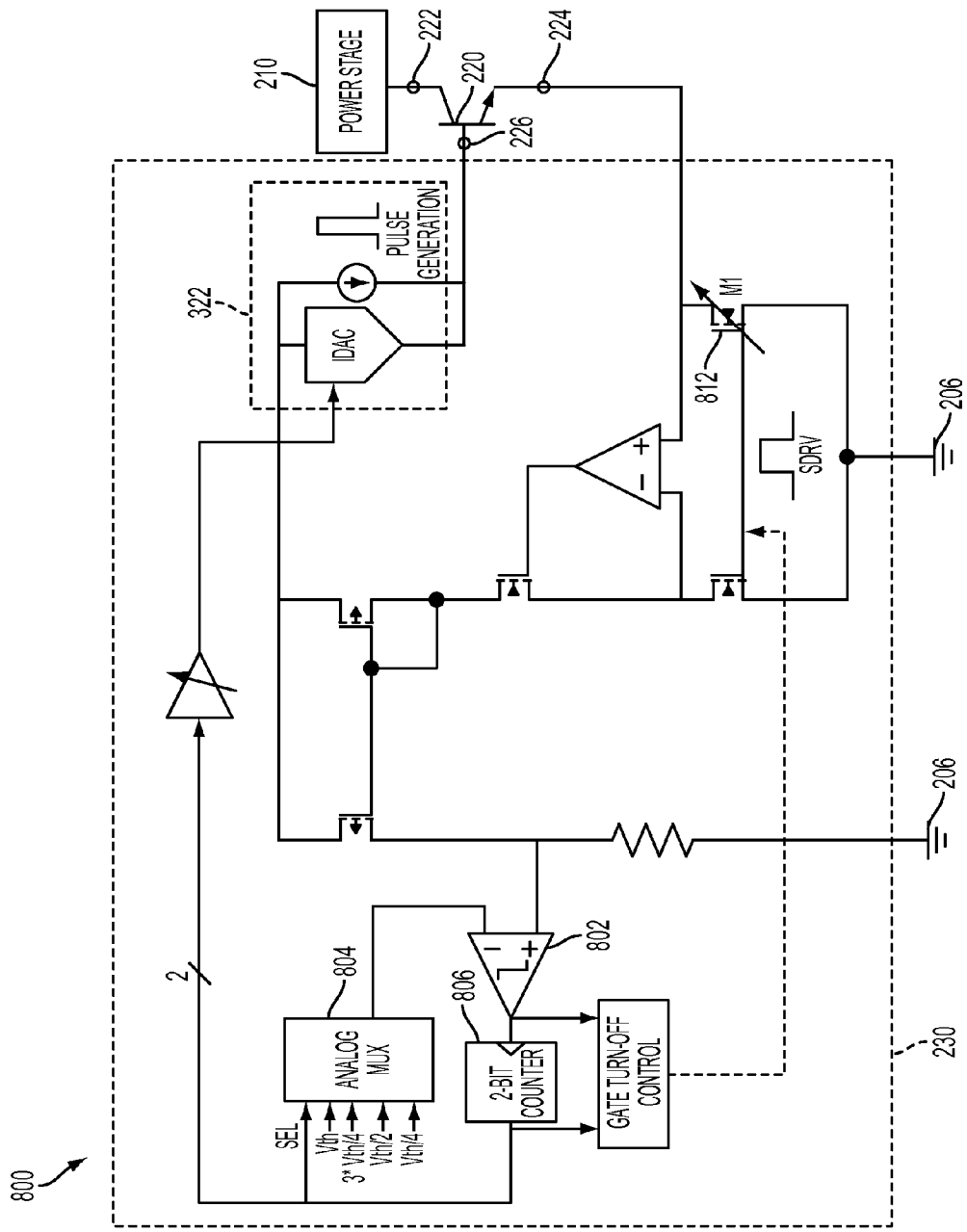
FIG. 8 is a circuit schematic illustrating a circuit for generating base current steps according to one embodiment of the disclosure.

The base current ramp rates adjusted by a controller as described above may be adjusted using discrete steps rather than a linear ramp. In this embodiment, an effective linear ramp may be achieved by stepping the base current through multiple levels. This may reduce instability within a feedback loop from the base current source 322 to the sense amplifier 336. The base current steps may be generated with multiple comparator thresholds as shown in FIG. 8. FIG. 8 is a circuit schematic illustrating a circuit for generating base current steps according to one embodiment of the disclosure. A circuit 800 within the IC 230 may include a comparator 802 coupled to receive at one input a variable threshold level set by an analog multiplexer (mux) 804. In one embodiment having a four step ramp, the mux 804 may begin by providing a threshold $V_{th}/4$ to the comparator 802 at a beginning of the first time period of turning on the BJT 220, while switch 812 is turned on with a desired number of unit devices N corresponding to peak emitter current $I_{pk}$. As the comparator 802 trips, a 2-bit counter output 806 increments by one and the threshold of the comparator 802 respectively increases to the following discrete values: $V_{th}/2$, $3*V_{th}/4$, and $V_{th}$. The base current supplied to the BJT is also respectively increased. If the 2-bit counter 806 reaches the value of three, where the comparator 802 threshold equals $V_{th}$, a subsequent trip of the comparator 802 causes the switch 812 to be turned off until the beginning of the next first time period.

Figure 9:
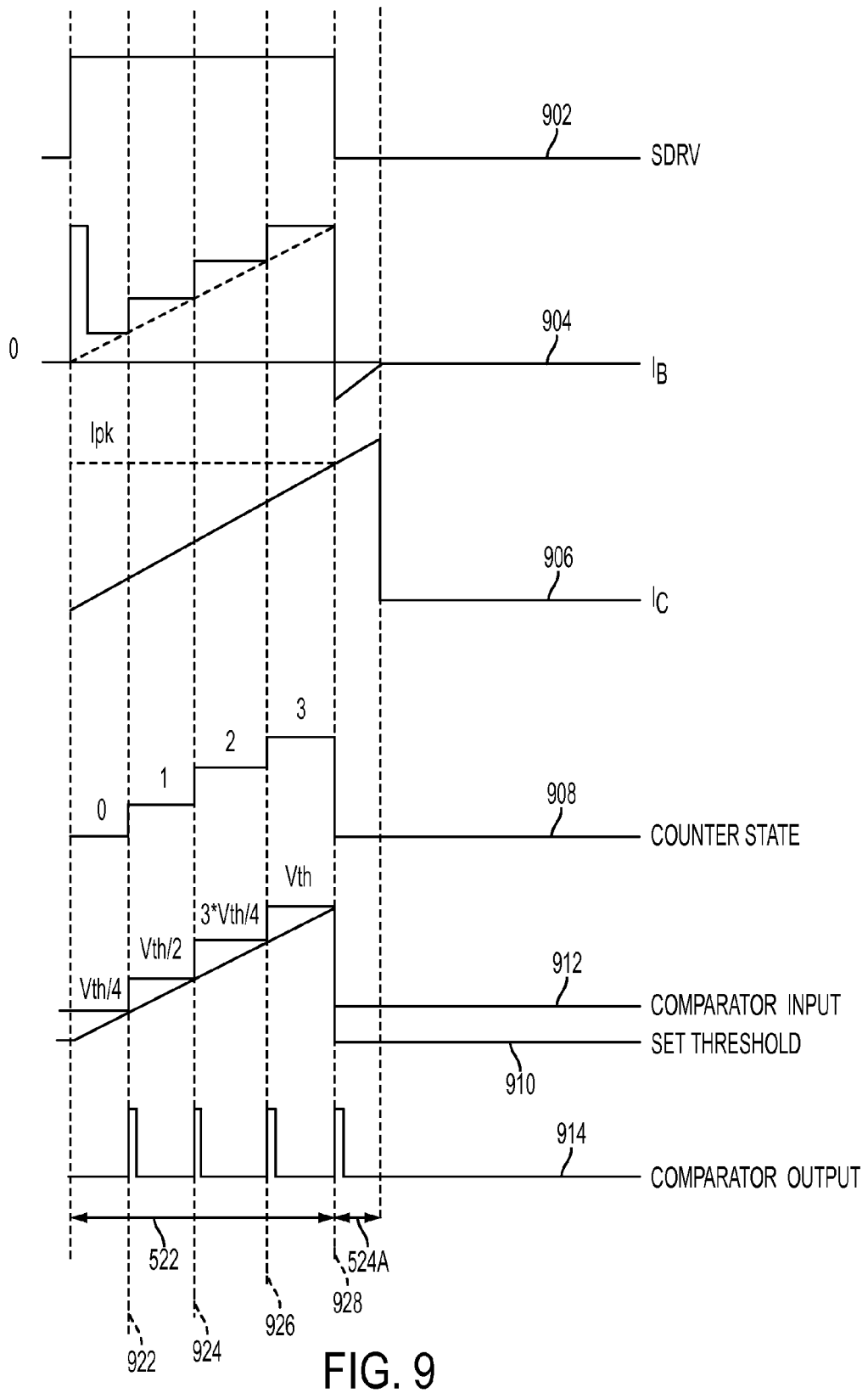
FIG. 9 are graphs illustrating generation of a stepped base current according to one embodiment of the disclosure.

The operation of generating a stepped base current for the BJT 220 is shown through the graphs of FIG. 9. FIG. 9 are graphs illustrating generation of a stepped base current according to one embodiment of the disclosure. The base current $I_B$ to the BJT 220 is shown in line 904 and includes an initial pulse followed by stepped increases for the duration of the first time period 522. The base current $I_B$ is negative for a short duration after the first time period 522 during a reverse recovery time period 524A. A line 902 illustrates a SDRV signal supplied to switch 812, which may be set to high during the first time period 522. A line 906 illustrates the collector current $I_C$, which may increase linearly during the first time period 522 and the reverse recovery time period 524A until the BJT 220 switches off.

The stepped increases shown in line 904 of the base current $I_B$ may be controlled by the output of the counter state shown in line 908, which controls the comparator threshold shown in line 912. The counter state 908 may begin at zero, which selects a threshold of $V_{th}/4$ for the comparator input 912. An input to the comparator 802 may increase proportional to the collector current IC of line 906.

When the input 912 reaches the threshold 912, the comparator output shown in line 914 switches state at time 922. This causes the counter state 908 to increase one, which in turn causes the threshold level 912 to increase to $V_{th}/2$ and the comparator output 914 to reset. This process repeats at times 924 and 926 to increase the threshold level to $3*V_{th}/4$ and $V_{th}$, respectively. After the counter state 908 reaches three, the next switch of the comparator output 914 switches off SDRV 902.

Figure 10:
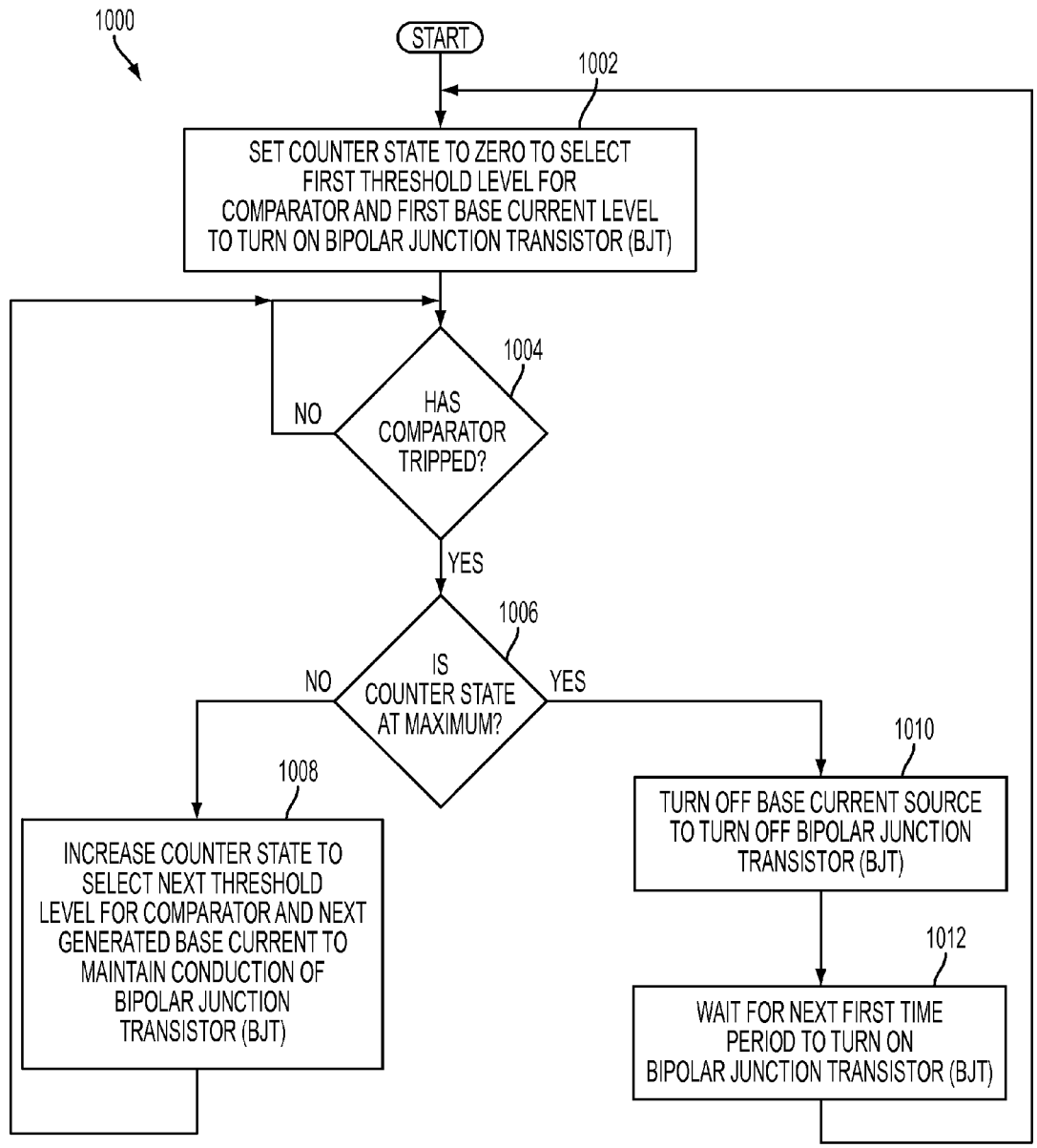
FIG. 10 is a flow chart illustrating a method for generating a stepped base current for controlling a bipolar junction transistor (BJT) according to one embodiment of the disclosure.

A method of operation of generating stepped base current is described generically in FIG. 10. FIG. 10 is a flow chart illustrating a method for generating a stepped base current for controlling a bipolar junction transistor (BJT) according to one embodiment of the disclosure. A method 1000 begins at block 1002 with setting a counter state to zero to select a first threshold level for the comparator and to select a first base current level to turn on the bipolar junction transistor (BJT). When the BJT turns on, the collector current provided at an input of the comparator may begin to increase. At block 1004, it is determined whether the comparator has tripped, indicating the input has reached the set threshold. When the comparator has tripped, the method 1000 proceeds to block 1006 to determine if the counter state is at a maximum value. For a 2-bit counter, the maximum value is three. However, other counters, such as a 3-bit counter, may also be used to vary the number of steps of base current available. When the counter state is not at a maximum value, the method 1000 proceeds to block 1008 to increase the counter state to select a next threshold level for the comparator and to select a next step of base current for providing to the BJT to maintain conduction of the BJT. The method 1000 then returns to waiting for the comparator to trip at block 1004 for that next threshold. When the maximum counter state is eventually reached at block 1006, the method 1000 proceeds to block 1010 to turn off the base current source to begin turning off the BJT. At block 1012, the method 1000 then waits for the next first time period when the BJT should be turned on again, at which time the method 1000 repeats starting at block 1002.

Figure 11:
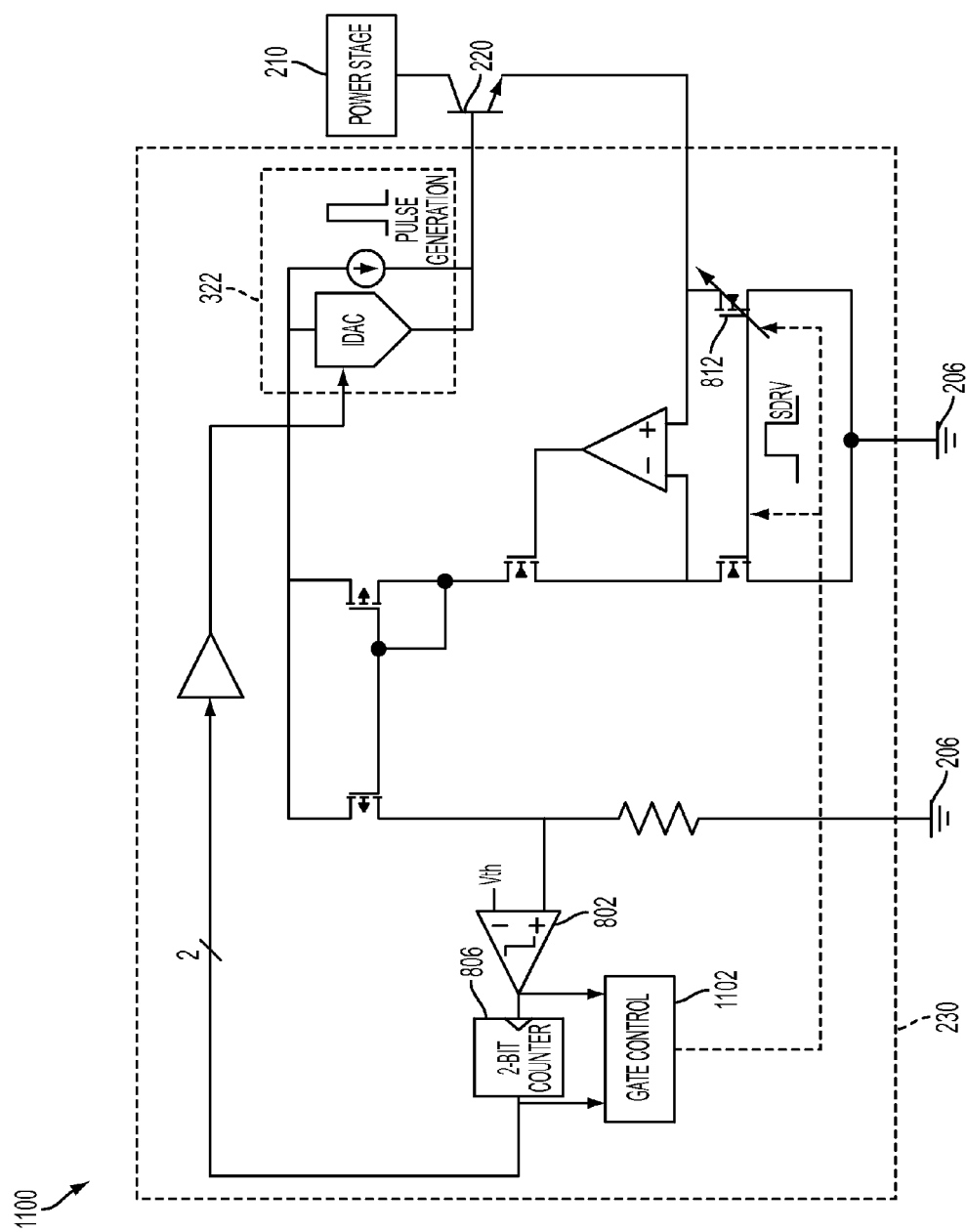
FIG. 11 is a circuit schematic illustrating a circuit for generating base current steps according to another embodiment of the disclosure.

The stepped base current for the BJT 220 may also be generated with variable source switch stripes by varying a number of devices connected in parallel to increase available current handling. FIG. 11 is a circuit schematic illustrating a circuit for generating base current steps according to another embodiment of the disclosure. The circuit 1100 is similar to the circuit 800 of FIG. 8. However, the comparator 802 may receive a fixed threshold level, $V_{th}$, which eliminates the mux 804. The switch 812 may be controlled by gate control block 1102 to be turned on with N/4 unit devices where N is the number of unit devices of switches 812 that correspond to the desired peak emitter current $I_{pk}$. As the comparator 802 trips, the 2-bit counter 806 output increments by one and the number of unit devices turned on respectively increases to the following discrete values: N/2, $3*N/4$, and N. The base current $I_B$ may also be updated based on the output of the counter 806. If the 2-bit counter 806 has a value of three, a subsequent trip of the comparator 802 may cause the switch 812 to be turned off until the beginning of the next first time period. In the circuit 1100, a voltage across the switch 812 may be higher on average than that of circuit 800 of FIG. 8, which may cause higher power consumption by the switch 812, but may offer improved immunity with respect to noise than the circuit 800 of FIG. 8.

Figure 12:
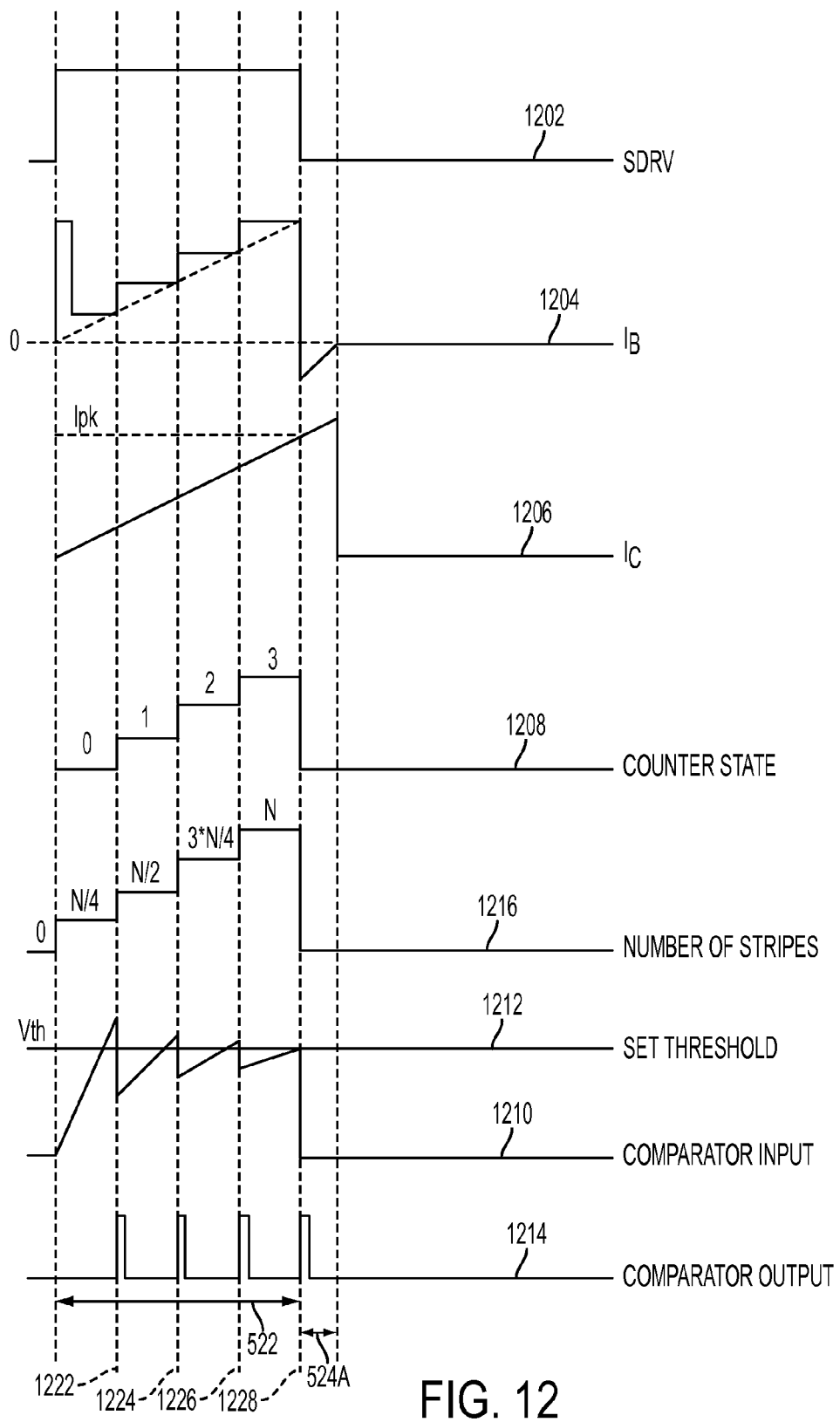
FIG. 12 are graphs illustrating generation of a stepped base current according to another embodiment of the disclosure.

Operation of the circuit 1100 to generate stepped base current is shown in one example in the graphs of FIG. 12. FIG. 12 are graphs illustrating generation of a stepped base current according to another embodiment of the disclosure.

The base current $I_B$ to the BJT 220 is shown in line 1204 and includes an initial pulse followed by stepped increases for the duration of the first time period 522. The base current $I_B$ is negative for a short duration after the first time period 522 during a reverse recovery time period 524A. A line 1202 illustrates a SDRV signal supplied to switch 812, which may be set to high during the first time period 522. A line 1206 illustrates the collector current $I_C$, which may increase linearly during the first time period 522 and the reverse recovery time period 524A until the BJT 220 switches off.

The stepped increases shown in line 1204 of the base current $I_B$ may be controlled by the output of the counter state shown in line 1208, which controls the number of stripes or number of active switches for handling current in line 1216. The counter state 1208 may begin at zero, which selects N/4 stripes. An input to the comparator 802 may increase proportional to the collector current $I_C$ of line 1206. When the input 1210 reaches the threshold 1212, the comparator output shown in line 1214 switches state at time 1222. This causes the counter state 1208 to increase one, which in turn causes the number of stripes 1216 to increase to N/2 and the comparator output 1214 to reset. This process repeats at times 1224 and 1226 to increase the number of stripes to 3*N/4 and N, respectively. After the counter state 1208 reaches three, the next switch of the comparator output 1214 switches off SDRV 1202.

Figure 13:
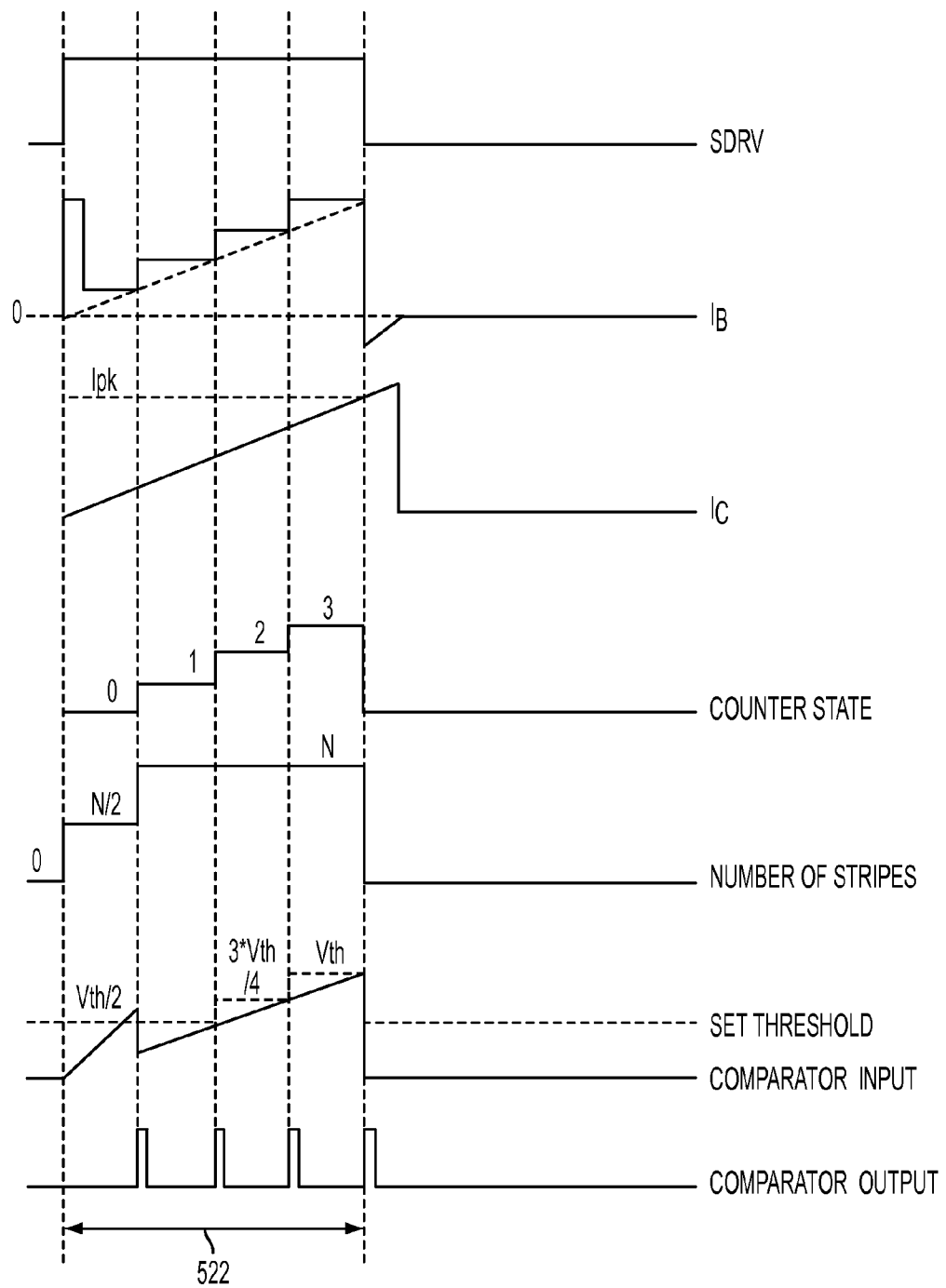
FIG. 13 are graphs illustrating generation of a stepped base current according to yet another embodiment of the disclosure.

In one embodiment, both varying thresholds and varying number of stripes may be used to generate the stepped base current. The combination may provide an appropriate compromise between consumed power and noise immunity. The operation of such a circuit may implement the circuit 800 of FIG. 8, including the mux 804, along with the gate control logic 1102 of FIG. 11. The output of a counter, such as a 2-bit counter, may control the number of unit devices in the switch 812 and the threshold for the comparator 802 as shown in Table 1. Graphs illustrating operation of such a circuit with a 2-bit counter are shown in FIG. 13. FIG. 13 are graphs illustrating generation of a stepped base current according to yet another embodiment of the disclosure.

TABLE 1

Control of stepped base current generation based on a counter output according to one embodiment of the disclosure.

| Counter Level | Number of unit devices | Comparator threshold |
|---|---|---|
| 0 | N/2 | $V_{th}/2$ |
| 1 | N | $V_{th}/2$ |
| 2 | N | $3*V_{th}/4$ |
| 3 | N | $V_{th}$ |

Figure 14:
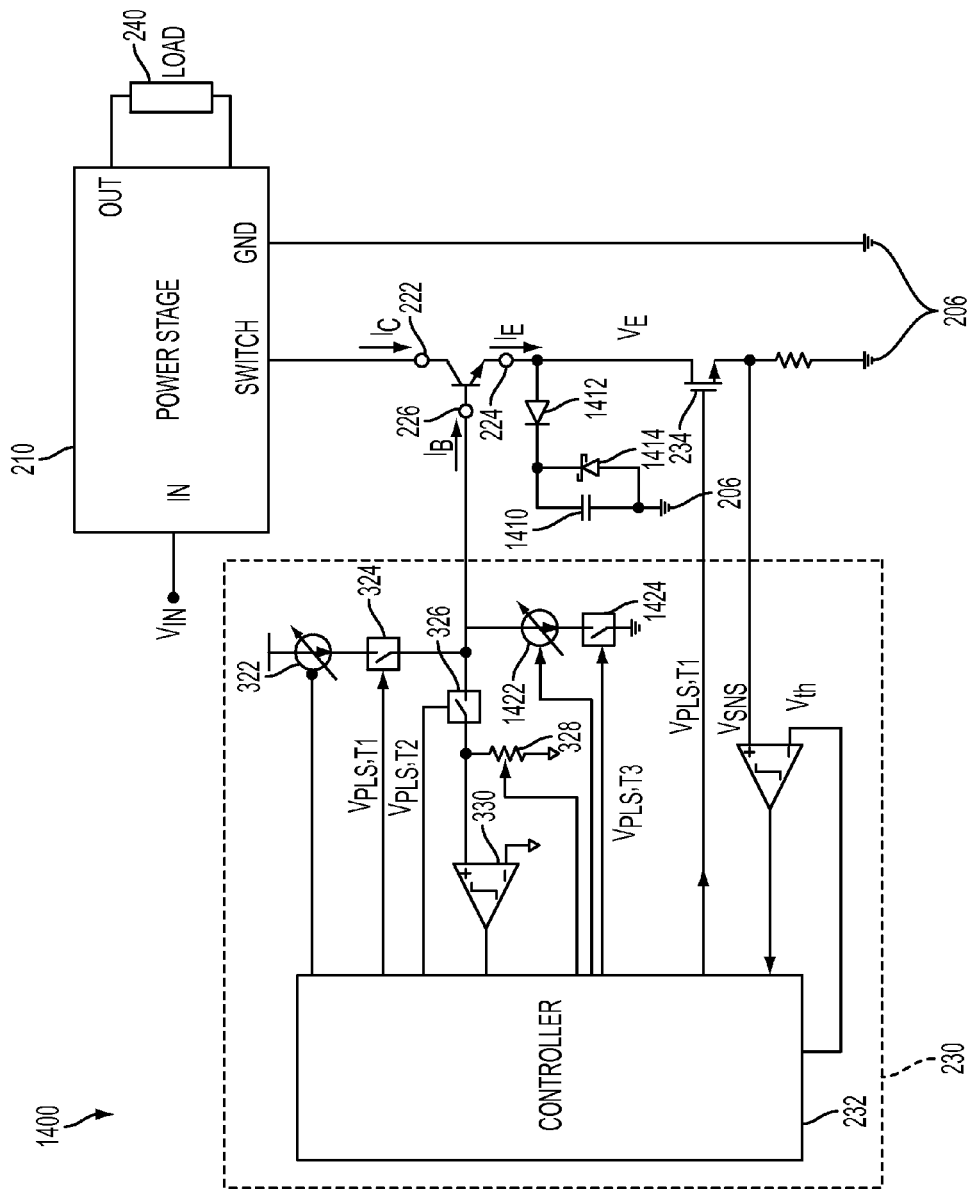
FIG. 14 is a circuit schematic illustrating control of a bipolar junction transistor (BJT) with a forward and a reverse base current source according to one embodiment of the disclosure.

The dynamic adjustment of the reverse recovery time period described above includes controlling the forward base current source 322 of FIG. 3. However, the reverse recovery time period may also be controlled with a reverse base current source as illustrated in FIG. 14. FIG. 14 is a circuit schematic illustrating control of a bipolar junction transistor (BJT) with a forward and a reverse base current source according to one embodiment of the disclosure. A circuit 1400 may be similar to the circuit 300 of FIG. 3, but also include a reverse base current source 1422 and a second reverse base switch 1424. The switch 1424 may be controlled by a $V_{PLS,T3}$ control signal generated by the controller 232. The controller 232 may switch on the switch 1424 and control the current source 1422 during a portion of or the entire reverse recovery time period of the BJT 220 to adjust the duration of the reverse recovery time period. In FIG. 14, the reverse recovery time period may thus be controlled through varying the resistor 328 and/or controlling the current source 1422. The use of current source 1422 may be advantageous over varying the resistor 328 in certain embodiments by allowing the controller 232 to set a current output level without measuring the base voltage of the BJT 220. For example, the controller 232 may set the current source 1422 to a value proportional to the collector current $I_C$ to reduce the reverse recovery time period.

Figure 15:
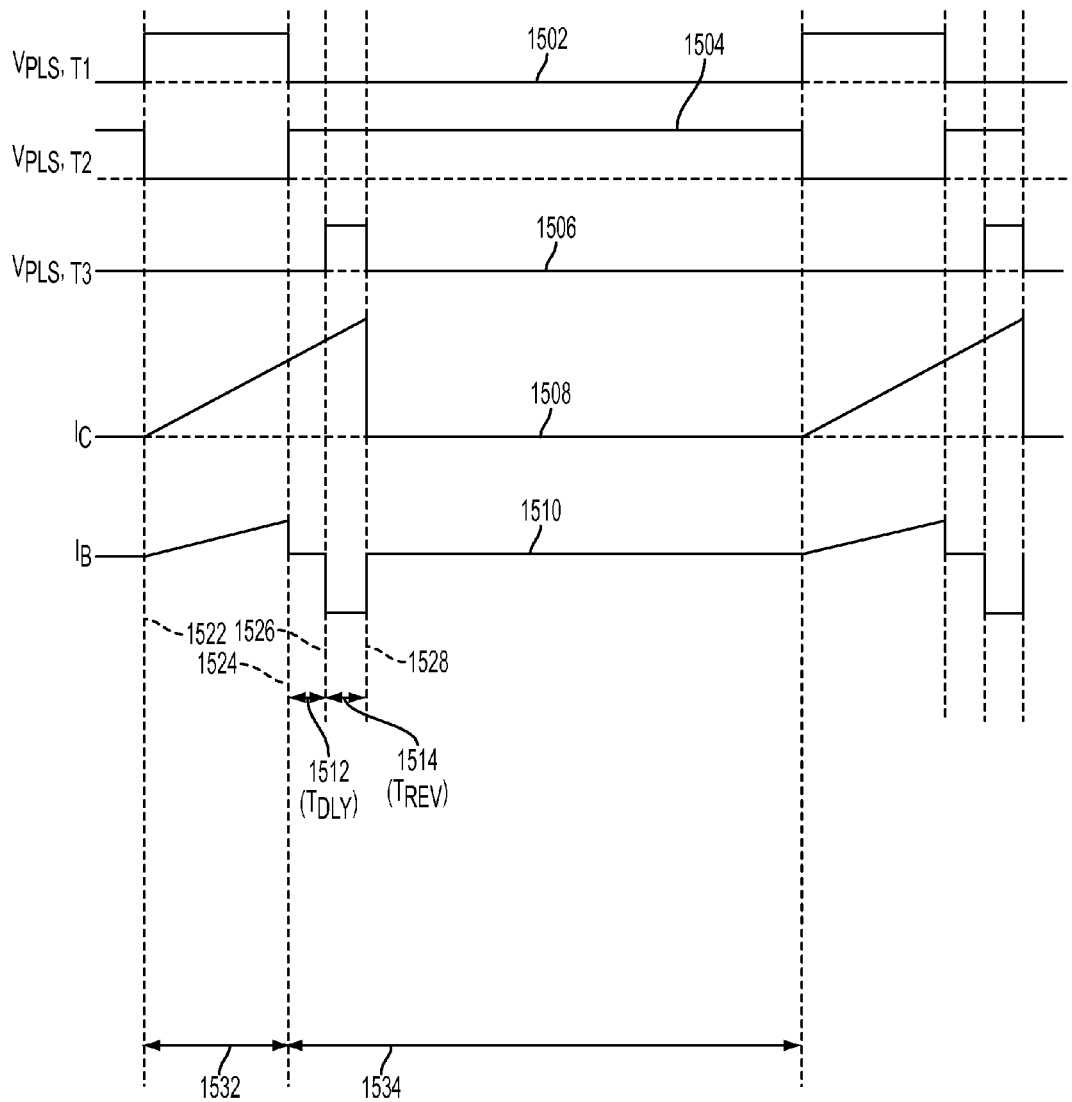
FIG. 15 are graphs illustrating dynamic adjustment of a reverse recovery period by a controller with a reverse base current source according to one embodiment of the disclosure.

One example of operation of the circuit of FIG. 14 is shown in the graphs of FIG. 15. FIG. 15 are graphs illustrating dynamic adjustment of a reverse recovery period by a controller with a reverse base current source according to one embodiment of the disclosure. Lines 1502, 1504, and 1506 represent control signals $V_{PLS,T1}$, $V_{PLS,T2}$, and $V_{PLS,T3}$, respectively, generated by the controller 232. At time 1522, the $V_{PLS,T1}$ signal switches high and the $V_{PLS,T2}$ signal switches low to turn on the BJT 220. While the BJT 220 is on, the collector current $I_C$ shown in line 1508 may linearly increase, and the controller 232 may dynamically adjust a base current $I_B$ shown in line 1510 proportionally to the collector current $I_C$. At time 1524, the $V_{PLS,T1}$ signal switches low to turn off the base current source and begin turning off of the BJT 220. Also at time 1524, the $V_{PLS,T2}$ signal switches high to couple the resistor 328 to the BJT 220 and allow measurement of the reverse base current and thus detection of the end of the reverse recovery time period. The controller 232 may then wait a time period $T_{DLY}$ 1512 before switching the $V_{PLS,T3}$ signal to high at time 1526 to couple the reverse base current source 1422 to the BJT 220. In one embodiment, the current source 1422 may be configured by the controller 232 to provide a current of between approximately 10% and 50% of the collector current $I_C$. The controller 232 may hold the $V_{PLS,T3}$ signal high for time period $T_{REV}$ 1514 to quickly discharge base charge from the BJT 220 to turn off the BJT 220. Although shown in FIG. 15 as a constant negative base current $I_B$ during time period 1514, the negative base current may be varied by the controller 232 adjusting the base current source 1422. The controller 232 may then switch the $V_{PLS,T3}$ signal to low when the reverse base current reaches zero, such as may be measured by the sense amplifier 330. After time 1528, the controller 232 may wait a delay period before repeating the sequence of times 1522, 1524, 1526, and 1528. The controller may repeat first time period 1532 and second time period 1534 to obtain a desired average current output to a load. Power is output to the load 240 during a portion of the second time period 1534 following the reverse recovery time periods 1512 and 1514. By controlling the durations of the first time period 1532, the reverse recovery time periods 1512 and 1514, and the second time period 1534, the controller 232 may regulate the average output current to the load 240.

During the time period $T_{DLY}$ 1512 a supply capacitor may be charged from current conducted through the BJT 220 during the reverse recovery time period. For example, a capacitor 1410 may be coupled to an emitter node 224 of the BJT 220 through a diode 1412 and zener 1414. The capacitor 1414 may be used, for example, to provide a supply voltage to the controller 232. By adjusting a duration of the time period $T_{DLY}$ 1512, the controller 232 may adjust a charge level on the capacitor 1410 and thus a supply voltage provided to the controller 232. The controller 232 may maintain the capacitor 1410 at a voltage between a high and a low threshold supply voltage to ensure proper operation of the controller 232. Time period $T_{DLY}$ 1512 and time period $T_{REV}$ 1514 may be modulated almost independently of each other, as long as the supplied base current $I_B$ drives the BJT 220 into saturation. If supply generation is not desired, then time period $T_{DLY}$ may be set to zero without changing the functioning of the rest of the circuit.

In some embodiments of the above circuits, the BJT 220 may have a base-emitter reverse breakdown voltage that must be avoided, such as a breakdown voltage of approximately 7 Volts. Thus, the controller may be configured to ensure that when the base is pulled down by the current source 1422, the voltage across the base node 226 and the emitter node 224 may remain below this limit. When the switch 234 is off, the emitter may float to $V_{ddh}+V_d$. If the supply voltage $V_{ddh}$ is close to the breakdown voltage, such as 7 Volts, the base pull down with current source 1422 may cause breakdown of the BJT 220. Thus, the controller 232, instead of pulling the base node 226 to ground, may pull the base node 226 to a fixed voltage which ensures the reverse voltage across the base node 226 and the emitter node 224 is less than the breakdown voltage, such as 7 Volts.

Certain parameters of the various circuits presented above may be used by the controller 232 to determine operation of the circuits. For example, the controller 232 may be configured to operate various components of the circuits based on detecting a beginning of a reverse recovery period. In one embodiment, the beginning of the reverse recovery period may be determined by detecting a signal from the comparator 330 of FIG. 3. In another embodiment, the beginning of the reverse recovery period may be determined by detecting a rise in voltage at the emitter node 224 from $V_{th}$ to $V_{ddh}+V_D$.

In another example, the controller 232 may be configured to operate various components based on detecting a start of a flyback period. In one embodiment, the controller 232 may assume that the end of the reverse recovery period is an approximation of the start of the flyback (e.g., second) time period. In another embodiment, the controller 232 may compare a voltage at the collector node 222 to a fixed threshold voltage with a comparator (not shown).

In yet another example, the controller 232 may be configured to operate various components based on a predicted peak collector current $I_C$. Methods for predicting peak collector current $I_C$ may include, for example, determining a delay time $T_{stg}$ during which the BJT 220 remains conducting in a reverse recovery phase. By determining a ramp rate of the collector current $I_C$, the final peak collector current may be determined by extrapolating based on the determined delay time $T_{stg}$.

In a further example, the controller 232 may be configured to operate various components based on detecting an end of the reverse recovery period. In one embodiment, the end of the reverse recovery period may be detected by measuring a voltage and/or current at the base node 226 of the BJT 220. For example, the comparator 330 of FIG. 3 may compare a voltage across the resistor 328 to a ground level (e.g., 0 Volts). During the reverse recovery phase, the switch 324 may be opened and the switch 326 may be closed. Thus, charge accumulated in the base of the BJT 220 may flow to ground through the resistor 328. When the voltage across the resistor 328 reaches zero, the comparator 330 may indicate that nearly all accumulated base charge has been removed from the BJT 220 and the reverse recovery period has ended. In certain embodiments, one or both terminals of the comparator 330 may be offset by an offset value (e.g., 1 Volt) to reduce error in the determination of the end of the reverse recovery period.

The end of the reverse recovery period may be detected within the various circuits described above by other methods. In another embodiment, the end of the reverse recovery period may be detected by measuring a voltage at the emitter node 224 of the BJT 220. When the switch 234 turns off, the voltage at the emitter node 224 may increase to $V_{ddh}+V_D$ and remain at this voltage during the reverse recovery time period. At the end of the period, the BJT 220 turns off and the voltage at the emitter node 224 may decrease below $V_{ddh}+V_D$. This drop may be detected by a sense amplifier (not shown) to determine the end of the reverse recovery period.

In yet another embodiment, the end of the reverse recovery period may be detected by measuring a voltage at the collector node 222 of the BJT 220. When the switch 234 and the BJT 220 are on, the voltage at the collector node 222 may be $V_{CE}+V_{DS}+V_{th}$, where $V_{CE}$ is a voltage between the collector node 222 and the emitter node 224, $V_{DS}$ is a voltage between the two terminals of the switch 234, and $V_{th}$ is a threshold voltage of the switch 234. When the switch 234 turns off, the voltage at the collector node may increase to $V_{ddh}+V_D \pm V_{CE}$. This change may indicate a beginning of the reverse recovery time period to the controller 232. At the end of the reverse recovery time period, the BJT 220 turns off and the voltage at the collector node 222 may increase towards $V_{IN}+V_{LOAD}$. This rise may be detected with a sense amplifier (not shown) to determine the end of the reverse recovery period.

Figure 16:
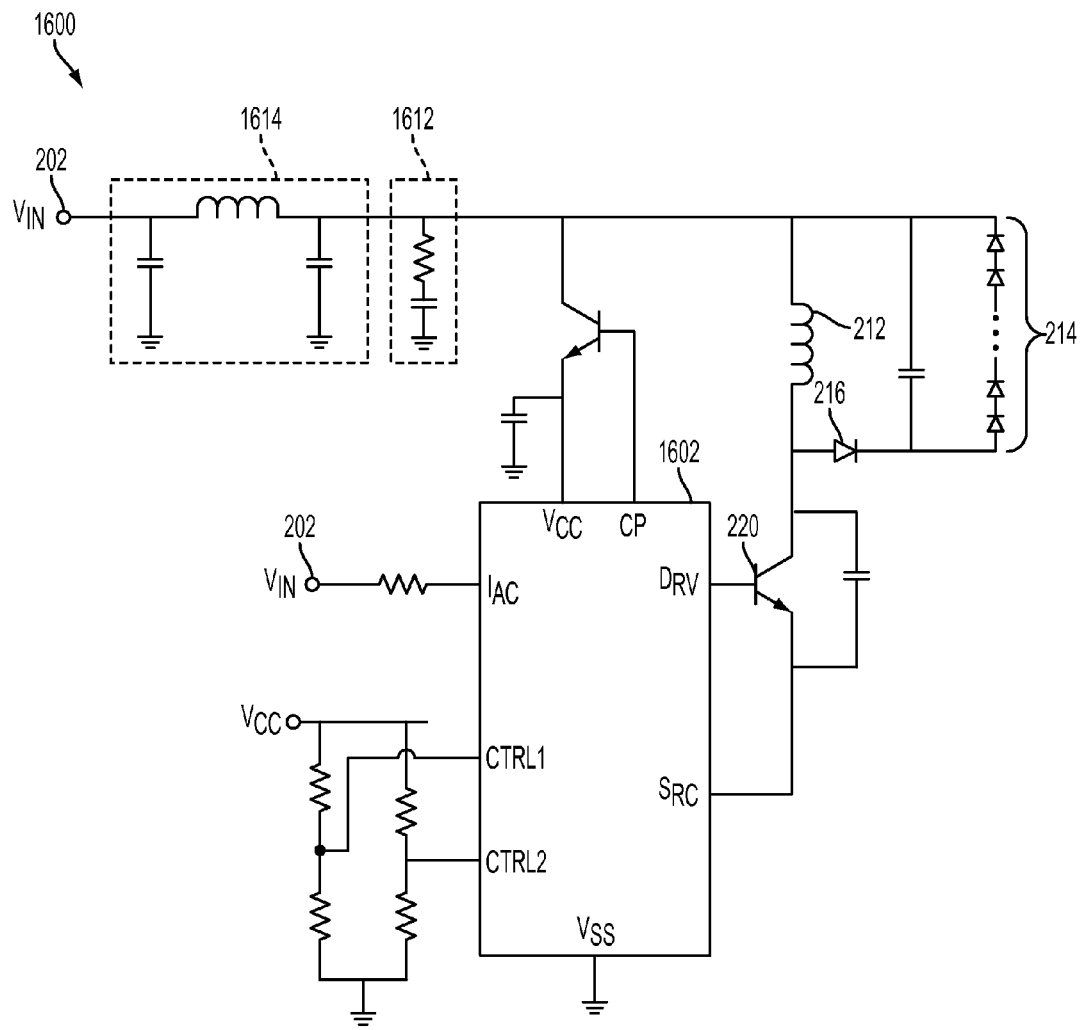
FIG. 16 is a circuit schematic of a direct-current-to-direct-current (DC-DC) converter with a control integrated circuit (IC) for regulating the DC-to-DC conversion according to one embodiment.

The various circuits described above may be packaged into an integrated circuit (IC) for use as part of a DC-DC converter circuit. One example DC-DC converter circuit is illustrated in FIG. 16. FIG. 16 is a circuit schematic of a DC-DC converter with a control integrated circuit (IC) for regulating the DC-to-DC conversion according to one embodiment. The circuit 1600 may include a controller 1602 coupled to the bipolar junction transistor (BJT) 220 for regulating energy transfer of energy to a load, such as LEDs 214. Although LEDs 214 are illustrated as a load for power consumption throughout this description, any load may be coupled to the circuit 1600 to receive regulated energy for consumption. In some embodiments, an electromagnetic interference (EMI) prevention circuit 1614 may be coupled between the line input $V_{IN}$ node 202 and the controller 1602. The $V_{IN}$ node 202 may receive a rectified alternating current (AC) input signal for operating the circuit 1600. In some embodiments, a snubber circuit 1612 may be coupled between the $V_{IN}$ node 202 and the controller 1602. The controller 1602 may output signals through a DRV output to a base of the BJT 220 and a SRC output to an emitter of the BJT 220. Other inputs may be provided to the controller 1602 for controlling the controller 1602 from an external component through the CTRL1 and CTRL2 inputs. Further, the controller 1602 may be configured with an input to sense current at the VIN 202 node. The controller 1602 may include certain circuits described above for controlling operation of the BJT 220, such as by dynamically adjusting a reverse recovery time period of the BJT 220 and maintaining an average current output to the LEDs 214.

Figure 17:
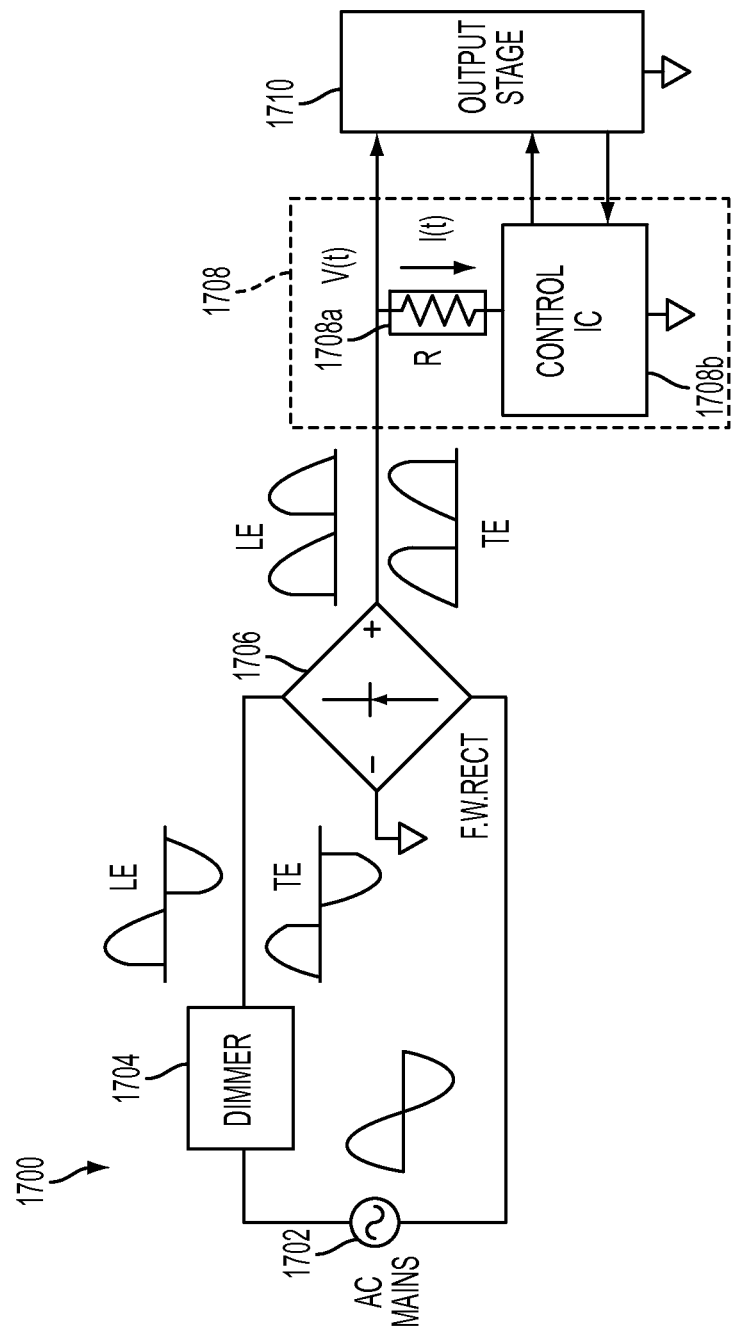
FIG. 17 is a block diagram illustrating a dimmer system for a light-emitting diode (LED)-based bulb with two terminal drive of a bipolar junction transistor (BJT)-based power stage according to one embodiment of the disclosure.

The circuits described above, including the control IC 1602 of FIG. 16, described above may be integrated into a dimmer circuit to provide dimmer compatibility, such as with lighting devices. FIG. 17 is a block diagram illustrating a dimmer system for a light-emitting diode (LED)-based bulb with two terminal drive of a bipolar junction transistor (BJT)-based power stage according to one embodiment of the disclosure. A system 1700 may include a dimmer compatibility circuit 1708 with a variable resistance device 1708a and a control integrated circuit (IC) 1708b. The dimmer compatibility circuit 1708 may couple an input stage having a dimmer 1704 and a rectifier 1706 with an output stage 1710, which may include light emitting diodes (LEDs). The system 1700 may receive input from an AC mains line 1702. The output stage 1710 may include a power stage based on a bipolar junction transistor (BJT) as described above. For example, the output stage 1710 may include an emitter-switched bipolar junction transistor (BJT) in the configurations of FIG. 2, FIG. 3, FIG. 8, FIG. 11, FIG. 14, and/or FIG. 16.

If implemented in firmware and/or software, the functions described above, such as with respect to FIG. 6, FIG. 7, and/or FIG. 10 may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically erasable programmable read-only memory (EEPROM), compact-disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. For example, although signals generated by a controller are described throughout as "high" or "low," the signals may be inverted such that "low" signals turn on a switch and "high" signals turn off a switch. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method comprising:
    driving a base current from a base current source to a base of a bipolar junction transistor (BJT) to maintain conduction of the bipolar junction transistor (BJT) during a first time period;
    disconnecting the base current source from the bipolar junction transistor (BJT) during a second time period;
    receiving a current measurement from a current detect circuit coupled to an emitter of the bipolar junction transistor (BJT);
    repeating the steps of driving the base current during the first time period and disconnecting the base current source for the second time period to obtain an average current output to a load; and
    dynamically adjusting the base current output from the base current source to adjust a reverse recovery time period of the bipolar junction transistor (BJT) based, at least in part, on the received current measurement.

2. The method of claim 1, wherein the step of dynamically adjusting the base current comprises dynamically adjusting the base current such that the base current is proportional to a collector current of the BJT.

3. The method of claim 1, wherein the step of adjusting the base current output comprises adjusting at least one of an initial base current pulse width, an initial base current pulse amplitude, an initial current for a ramp, and a base current ramp rate to control an amount of charge stored at the base of the bipolar junction transistor (BJT) at the end of the first time period.

4. The method of claim 1, wherein the step of dynamically adjusting comprises maintaining the reverse recovery time period between a low threshold and a high threshold.

5. The method of claim 1, further comprising:
    delaying, for a first portion of the reverse recovery time period, to allow charging of an energy storage device during the first portion of the reverse recovery time period; and
    coupling a negative base current source to the base of the bipolar junction transistor (BJT) for a second portion of the reverse recovery time period after the first portion to drain excess base charge from the bipolar junction transistor (BJT).

6. The method of claim 5, further comprising dynamically adjusting the first portion of the reverse recovery time period to obtain a desired supply for the energy storage device.

7. The method of claim 5, wherein the step of dynamically adjusting the first portion comprises adjusting the first portion to zero.

8. The method of claim 1, wherein the step of dynamically adjusting the base current comprises controlling a negative base current after disconnecting the base current source, wherein the negative base current is proportional to a peak collector current of the bipolar junction transistor (BJT).

9. The method of claim 8, further comprising applying a suitable negative voltage across a base-emitter junction of the bipolar junction transistor (BJT) while applying the negative base current.

10. The method of claim 1, further comprising:
    determining the reverse recovery time period by measuring a parameter of the bipolar junction transistor (BJT), wherein the step of dynamically adjusting the base current is based, at least in part, on the determined reverse recovery time period.

11. The method of claim 10, wherein the step of determining the reverse recovery time period comprises measuring at least one of a voltage and a current at a base of the bipolar junction transistor (BJT).

12. The method of claim 10, wherein the step of determining the reverse recovery time period comprises measuring a voltage of at least one of an emitter and a collector of the bipolar junction transistor (BJT).

13. An apparatus, comprising:
a controller configured to couple to a base and to an emitter of a bipolar junction transistor (BJT),
wherein the controller is configured to perform the steps comprising:
driving a base current from a base current source to the base of the bipolar junction transistor (BJT) to maintain conduction of the bipolar junction transistor (BJT) during a first time period;
disconnecting the base current source from the bipolar junction transistor (BJT) during a second time period;
receiving a current measurement from a current detect circuit coupled to an emitter of the bipolar junction transistor (BJT);
repeating the steps of driving the base current during the first time period and disconnecting the base current source for the second time period to obtain an average current output to a load; and
dynamically adjusting the base current output from the base current source to adjust a reverse recovery time period of the bipolar junction transistor (BJT) based, at least in part, on the received current measurement.

14. The apparatus of claim 13, wherein the step of dynamically adjusting the base current comprises dynamically adjusting the base current such that the base current is proportional to a collector current of the BJT.

15. The apparatus of claim 13, wherein the step of controlling the base current comprises adjusting at least one of an initial base current pulse width, an initial base current pulse amplitude, an initial current for a ramp, and a base current ramp rate to control an amount of charge stored at the base of the bipolar junction transistor (BJT) at the end of the first time period.

16. The apparatus of claim 13, wherein the step of dynamically adjusting the first time period duration comprises maintaining the reverse recovery time period between a low threshold and a high threshold.

17. The apparatus of claim 13, wherein the controller is further configured to perform the steps comprising:
delaying, for a first portion of the reverse recovery time period, to allow charging of an energy storage device during the first portion of the reverse recovery time period; and
coupling a negative base current source to the base of the bipolar junction transistor (BJT) for a second portion of the reverse recovery time period after the first portion to drain excess base charge from the bipolar junction transistor (BJT).

18. The apparatus of claim 17, wherein the controller is further configured to perform the step of dynamically adjusting the first portion of the reverse recovery time period to obtain a desired supply for the energy storage device.

19. The apparatus of claim 17, wherein the step of dynamically adjusting the first portion comprises adjusting the first portion to zero.

20. The apparatus of claim 13, wherein the step of dynamically adjusting the base current comprises applying a negative base current after disconnecting the base current source, wherein the negative base current is proportional to a peak collector current of the bipolar junction transistor (BJT).

21. The apparatus of claim 20, wherein the controller is further configured to perform the step of applying a suitable negative voltage across a base-emitter junction of the bipolar junction transistor (BJT) while applying the negative base current.

22. The apparatus of claim 13, wherein the controller is further configured to perform the step of:
determining the reverse recovery time period by measuring a parameter of the bipolar junction transistor (BJT),
wherein the step of dynamically adjusting the base current output is based, at least in part, on the determined reverse recovery time period.

23. The apparatus of claim 22, wherein the step of determining the reverse recovery time period comprises measuring at least one of a voltage and a current at a base of the bipolar junction transistor (BJT).

24. The apparatus of claim 22, wherein the step of determining the reverse recovery time period comprises measuring a voltage of at least one of an emitter and a collector of the bipolar junction transistor (BJT).

25. An integrated circuit (IC), comprising:
a base current source configured to be coupled to a base of the bipolar junction transistor (BJT) through a first base switch; and
a controller coupled to the base current source and configured to couple to an emitter switch coupled to an emitter of the bipolar junction transistor (BJT),
wherein the controller is configured to perform the steps comprising:
driving a base current from the base current source to the base of the bipolar junction transistor (BJT) to maintain conduction of the bipolar junction transistor (BJT) during a first time period;
disconnecting the base current source from the bipolar junction transistor (BJT) during a second time period;
receiving a current measurement from a current detect circuit coupled to an emitter of the bipolar junction transistor (BJT);
repeating the steps of driving the base current during the first time period and disconnecting the base current source for the second time period to obtain an average current output to a load; and
dynamically adjusting the base current output from the base current source to adjust a reverse recovery time period of the bipolar junction transistor (BJT), wherein at least a portion of the base current is proportional to a collector current of the bipolar junction transistor (BJT) based, at least in part, on the received current measurement.

26. The integrated circuit of claim 25, wherein the controller is configured to perform the step of repeating to obtain an average current output to a plurality of light emitting diodes (LEDs).

27. The integrated circuit of claim 25, further comprising:
an emitter sense amplifier configured to be coupled to an emitter switch coupled to the emitter of the bipolar junction transistor (BJT),
wherein the controller is further configured to couple to the emitter switch, and
wherein the controller is further configured to perform the steps comprising:
switching on the emitter switch during the first time period; and
switching off the emitter switch during the second time period;

determining the collector current of the bipolar junction transistor (BJT) based, at least in part, on an output of the emitter sense amplifier, wherein the step of dynamically adjusting the base current is based, at least in part, on the determined collector current.

28. The integrated circuit of claim 25, further comprising:

a second base current source configured to couple to the base of the bipolar junction transistor; and a third base switch coupled to the second base current source and to a ground, wherein the controller is configured to perform the steps of:

switching on the third base switch after the first time period; and dynamically adjusting the second base current source to adjust the reverse recovery time period of the bipolar junction transistor (BJT).

\* \* \* \* \*